(12) United States Patent
Harada et al.

(10) Patent No.: US 6,278,140 B1
(45) Date of Patent: Aug. 21, 2001

(54) INSULATED GATE THYRISTOR

(75) Inventors: Yuichi Harada; Noriyuki Iwamuro; Tadayoshi Iwaana, all of Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/511,167

(22) Filed: Feb. 24, 2000

Related U.S. Application Data

(62) Division of application No. 09/054,946, filed on Apr. 3, 1998, now Pat. No. 6,054,728.

(30) Foreign Application Priority Data

Apr. 8, 1997 (JP) .................................................. 9-089546

(51) Int. Cl.$^7$ .......................... H01L 29/74; H01L 31/111
(52) U.S. Cl. ......................... 257/133; 257/137; 257/152; 257/168
(58) Field of Search .................... 257/133, 137, 257/138, 152, 168, 169

(56) References Cited

U.S. PATENT DOCUMENTS

| | | | |
|---|---|---|---|
| 4,847,671 | 7/1989 | Pattanayak et al. | 357/38 |
| 4,857,983 | 8/1989 | Baliga et al. | 357/38 |
| 4,888,627 | 12/1989 | Pattanayak et al. | 357/23.4 |
| 4,912,541 | 3/1990 | Baliga et al. | 357/38 |
| 5,317,171 | 5/1994 | Shekar et al. | 257/138 |
| 5,319,222 | 6/1994 | Shekar et al. | 257/138 |
| 5,914,503 | * 6/1999 | Iwamuro et al. | 257/133 |
| 5,936,267 | * 8/1999 | Iwamuro | 257/147 |

OTHER PUBLICATIONS

MOS Controlled Thyristors (MCT'S),V.A.K. Temple General Electric Co., pp. 282–285 with abstract. IEDM 84.

(List continued on next page.)

Primary Examiner—Ngân V. Ngô
(74) Attorney, Agent, or Firm—Rossi & Associates

(57) ABSTRACT

An insulated gate thyristor is provided which includes: a first-conductivity-type base layer, first and second-conductivity-type base regions formed in the base layer, a first-conductivity-type source region formed in the first base region, a first-conductivity-type emitter region formed in the second base region, and a gate electrode layer formed on a gate insulating film over the first base region, first-conductivity-type base layer, and second base region, which are interposed between the first-conductivity-type source region and the first-conductivity-type emitter region. The thyristor further includes a first main electrode that contacts with both the first base region and the first-conductivity-type source region, a second-conductivity-type emitter layer formed on the other surface of the first-conductivity-type base layer, a second main electrode that contacts with the second-conductivity-type emitter layer, a gate electrode connected to the gate electrode layer; and an insulating film covering entire surface areas of the second second-conductivity-type base region and the first-conductivity-type emitter region. In this insulated gate thyristor, an exposed surface portion of the first second-conductivity-type base region that is interposed between the first-conductivity-type base layer and the first-conductivity-type source region has a smaller width than an exposed surface portion of the second second-conductivity-type base region interposed between the first-conductivity-type base layer and the first-conductivity-type emitter region.

3 Claims, 27 Drawing Sheets

OTHER PUBLICATIONS

Comparison of RBSOA of ESTs with IGBTs and MCTs, N. Iwamura, B.J. Baliga,R. Kurlagunda,G. Mann and A W.Kelley Power Semiconductor Research Center,North carolina State University pp. 195–199 with abstract, Jun. 1994.

The MOS–Gated Emitter Switched Thyristor, By B. Jayant Baliga, IEEE Electron Device Letters, vol. 11, no. 2 Feb. 1990, pp. 75–77.

A Study of EST's Short–Circuit SOA,N. Iwamuro,M.S. Shekar and B.J. Baliga, Power Semiconductor Research Center, North Carolina State University, pp. 71–76 with Abstract. IEEE 1993.

High Voltage Current Saturation in Emitter Switched Thyristors, M.S. Shekar, B.J. Baliga,Fellow IEEE,M. Nandakumar,S.Tandon, and A.Reisman, IEEE Electron Device Letters, vol. 12, No. 7, Jul. 1991, pp. 387–389 with abstract.

* cited by examiner

INSULATED GATE THYRISTOR

This is a Division of application Ser. No. 09/054,946 filed Apr. 3, 1998, now U.S. Pat. No. 6,054,728.

FIELD OF THE INVENTION

The present invention relates in general to an insulated gate thyristor. More specifically, the invention related to an insulated gate thyristor used as a power switching device.

BACKGROUND OF THE INVENTION

Thyristors have been used as indispensable devices for large capacity power switching owing to the low ON-state voltage characteristic. Gate Turn-Off (GTO) thyristors, for example, are widely used in these days in high-voltage large-current range applications. The GTO thyristor, however, has revealed drawbacks as follows: first, the GTO thyristor requires large gate current for turn-off, in other words, the thyristor has a relatively small turn-off gain; and secondly, a large-sized snubber is needed to safely turn off the GTO thyristor. In addition, since the GTO thyristor does not show current saturation in its current-voltage characteristic, a passive component, such as a fuse, must be coupled to the thyristor so as to protect a load from short-circuiting. This greatly impedes the reduction in the size and cost of the whole system.

MOS controlled thyristor (hereinafter abbreviated as MCT) as a voltage-driven type thyristor was proposed by V. A. K. Temple in IEEE IEDM Tech. Dig., 1984, p282. Since then, the characteristics of this type of thyristor have been analyzed and improved in various institutions worldwide. This is because the MCT, which is a voltage-driven type device, requires a far simpler gate circuit than the GTO thyristor, while assuring a relatively low ON-state voltage characteristic. The MCT, however, does not show a current saturation characteristic as in the case of the GTO thyristor, and therefore requires a passive component, such as a fuse, in its practical use.

Dr. Pattanayak and others revealed than an emitter switched thyristor (hereinafter abbreviated as EST) shows a current saturation characteristic, as disclosed in U.S. Pat. No. 4,847,671 (Jul. 11, 1989). Subsequently, M. S. Shekar and others proved by actual measurements that a dual channel type emitter switched thyristor (EST-1) shows a current saturation characteristic even in a high voltage range, as disclosed in IEEE Electron Device Letters vol. 12 (1991), p387. In Proceedings of IEEE ISPSD '93, p71 and Proceedings of IEEE ISPSD '94, p195, the inventors of the present invention disclosed results of their analysis on a forward bias safe operation area (FBSOA) and a reverse bias safe operation area (RBSOA) of this EST, and paved the way to the development of a voltage-driven type thyristor having the safe operation area in which the device operates safely when a load is short-circuited. FIG. 39 shows the structure of this EST device.

In the device as shown in FIG. 39, a first p base region 4, $p^{30}$ well region 5 and a second p base region 6 are formed in surface layer of an n base layer 3 deposited on a p emitter layer 1 via an $n^+$ buffer layer 2. The $p^+$ well region 5 forms a part of the first p base layer 4, and has a relatively large diffusion depth. An n source region 7 is formed in a surface layer of the first p base region 4, and an n emitter layer 8 is formed in a surface layer of the second p base region 6. A gate electrode 10 is formed on a gate oxide film 9 over a portion of the first p base region 4 that is interposed between the n source region 7 and an exposed portion of the n base layer 3, and a portion of the second p base region 6 that is interposed between the n emitter region 8 and the exposed portion of the n base layer 3. Each of the n source region 7, n emitter region 8 and the gate electrode 10 has a limited length in the Z-direction in FIG. 39, and the first p base region 4 and the second p base region 6 are coupled to each other outside these regions 7, 8 and electrode 10. Further, L-shaped $p^+$ well region 5 is formed outside the coupled portion of the first and second p base regions 4, 6. A cathode electrode 11 is formed in contact with both the surface of the $p^+$ well region 5, and the surface of the n source region 7. On the other hand, an anode electrode 12 is formed over the entire area of the rear surface of the p emitter layer 1.

When the cathode electrode 11 of this device is grounded, and positive voltage is applied to the gate electrode 10 while positive voltage is applied to the anode electrode 12, an inversion layer (partial accumulation layer) is formed under the gate oxide film 9, and a lateral MOSFET is thus turned on. As a result, electrons are supplied from the cathode electrode 11 to the n base layer 3, through the n source region 7, and the inversion layer (channel) formed in the surface layer of the first p base region 4. These electrons function as base current for a pnp transistor which consists of the p emitter layer 1, $n^+$ buffer layer 2 and n base layer 3, and the first and second p base regions 4, 6 and $p^+$ well region 5. This pnp transistor operates with this base current. Then, holes are injected from the p emitter layer 1, and flow into the first p base region 4 through the $n^+$ buffer layer 2 and n base layer 3. A part of the holes flow into the second p base region 6, and then flow under the n emitter region 8 in the Z direction to the cathode electrode 11. Thus, the device operates in an IGBT (insulated gate bipolar transistor) mode. With a further increase in the current, the pn junction between the n emitter region 8 and the second p base region 6 is forward biased, and a thyristor portion consisting of the p emitter layer 1, $n^+$ buffer layer 2, n base layer 3, second p base region 6 and n emitter region 8 latches up. In this case, the device operates in a thyristor mode. To turn off the EST, the MOSFET is turned off by lowering the potential of the gate electrode 10 below the threshold of the lateral MOSFET. As a result, the n emitter region 8 is potentially separated from the cathode electrode 11, and the device stops operating in the thyristor mode.

FIGS. 40 and 41 are cross sectional views of improved ESTs as disclosed in U.S. Pat. No. 5,317,171 issued May 31, 1994 and U.S. Pat. No. 5,319,222 issued Jun. 7, 1994 to M. S. Shekar et al. The improved EST of FIG. 41, in particular, is different from the EST shown in FIG. 39, and is designed so as to provide a further lowered ON-state voltage characteristic.

FIG. 42 is a cross-sectional view of a FET controlled thyristor as disclosed in U.S. Pat. No. 4,502,070 issued Feb. 26, 1985 to L. Leipold et al. This thyristor is characterized in that the electrode is not in contact with the second p base region 6.

As is understood from the above description, the EST as shown in FIG. 39 utilizes the holes flowing in the second p base region 6 in the Z direction so as to forward bias the pn junction between the second p base region 6 and the n emitter region 8, and therefore a degree of strength of the forward bias decreases in the Z direction toward a contact area of the second p base region 6 with the cathode electrode 11. Namely, the amount of electrons injected from the n emitter region 8 is not uniform over the length of the pn junction in the Z direction. If this EST is switched from this ON state to the OFF state, a weakly biased portion of the pn junction near the contact area with the cathode electrode 11 initially resumes its reverse-blocking ability, and a deeply biased portion of the pn junction remote from the contact area with the cathode electrode 11 slowly resumes the same ability. This tends to cause current localization or concentration upon turn-off, resulting in lowered capability to withstand breakdown of the EST during turn-off.

Although the EST shown in FIG. 40 operates in a similar manner to the EST of FIG. 39, the EST of FIG. 40 can be turned off more quickly since the cathode electrode 11 extends in the Y direction, to be in direct contact with the surface of the second p base region 6. Further, the EST of FIG. 40 shows a uniform turn-off characteristic due to the absence of the hole current flowing in the Z direction. In the operation of this thyristor, however, minority carriers are not uniformly injected in the horizontal direction (Y direction) when the pn junction between the n emitter region 8 and the second p base region 6 is turned on, and therefore the ON-state voltage cannot be lowered as expected. If the impurity concentration of the second p base region 6 is reduced to increase its resistance in an attempt to solve this problem, for example, a depletion layer is punched through the n emitter region 8 when a high voltage is applied in the forward direction. Thus, the conventional EST cannot achieve a sufficiently high breakdown voltage.

In the device shown in FIG. 41, the n emitter region 8 extends beyond the second p base region 6 so as to further lower the ON-state voltage. This structure, however, is unable to withstand a high voltage applied in the forward direction.

In the device shown in FIG. 42, the n emitter region 8 and second base region 6 are completely separated from the cathode electrode 11, thus preventing the non-uniform operation of the thyristor. This structure, however, has drawbacks as follows: first, the device shows reduced capability to withstand breakdown, namely, has a low breakdown voltage, since the hole current flows through the device such that it concentrates on the side of the first p base region; and secondly, the conductance in the operation of the transistor in the IGBT mode is reduced due to the contact-type FET effect.

In addition, both the EST and FET controlled thyristor suffer from such problems that the maximum current (limit current) that can flow through the device is large, and the device has a low breakdown voltage upon short-circuiting of a load.

SUMMARY OF THE INVENTION

The present invention has been developed not only to solve the above problems, but also to assure a sufficiently low ON-state voltage that is a basic characteristic of insulated gate thyristors. It is therefore an object of the present invention to provide an insulated gate thyristor which is able to uniformly resume the reverse-blocking ability of the pn junction upon turn-off of the thyristor to thus provide a high breakdown voltage during turn-off, and exhibits high capability to withstand breakdown upon short-circuiting of a load, while assuring a sufficiently low ON-state voltage.

According to the first aspect of the present invention, an insulated gate thyristor is provided which includes: a first-conductivity-type base layer having a high resistivity; first and second second-conductivity-type base regions formed in selected portions of a surface layer of the first-conductivity-type base layer at a first major surface thereof; a first-conductivity-type source region formed in a selected portion of a surface layer of the first second-conductivity-type base region; a first-conductivity-type emitter region formed in a selected portion of a surface layer of the second second-conductivity-type base region; a gate electrode layer formed on a gate insulating film over a surface of the first second-conductivity-type base region, an exposed portion of the first-conductivity-type base layer, and a surface of the second second-conductivity-type base region, which surfaces and exposed portion are interposed between the first-conductivity-type source region and the first-conductivity-type emitter region; a first main electrode that contacts with both an exposed portion of the first second-conductivity-type base region and the first-conductivity-type source region; a second-conductivity-type emitter layer formed on a second major surface of the first-conductivity-type base layer; a second main electrode that contacts with the second-conductivity-type emitter layer; a gate electrode that contact with the gate electrode layer; and an insulating film covering entire areas of surfaces of the second second-conductivity-type base region and the first-conductivity-type emitter region, wherein an exposed surface portion of the first second-conductivity-type base region that is interposed between the first-conductivity-type base layer and the first-conductivity-type source region has a smaller width than an exposed surface portion of the second second-conductivity-type base region interposed between the first-conductivity-type base layer and the first-conductivity-type emitter region.

In the insulated gate thyristor constructed as described above, when a voltage is applied to the insulated gate electrode so that an inversion layer appears right under the gate electrode, the potential of the first-conductivity-type emitter region becomes equal to that of the first main electrode through a channel region of MOSFET, and a thyristor consisting of the first-conductivity-type emitter region, second second-conductivity-type base region, first-conductivity-type base layer and second-conductivity-type emitter layer is turned on. Since electrons are uniformly injected from the entire first-conductivity-type emitter region upon turn-on of the thyristor, the device is quickly switched to the thyristor mode, and the ON-state voltage is reduced. Thus, the turn-on operation of the present device does not require hole current that flows in the Z-direction through the second second-conductivity-type base region as in the conventional EST. During turn-off, on the other hand, the pn junction can uniformly resume its reverse-blocking ability, causing no current concentration, with a result of an increased breakdown voltage. Further, the width of the channel region of the first second-conductivity-type base region is reduced, whereby the channel resistance is reduced, and the ON-state voltage is lowered.

Preferably, the impurity concentration of the first second-conductivity-type base region is lower than that of the second second-conductivity-type base region. In this case, the conductivity of the inversion layer that appears in the surface of the first second-conductivity-type base region is improved when a voltage is applied to the gate electrode.

In one preferred form of the invention, the gate insulating film formed on the first second-conductivity-type base region and the first-conductivity-type base layer has a smaller thickness than the insulating film formed on the second second-conductivity-type base region. In this case, the conductivity of the inversion layer that appears in the surface layer of the first second-conductivity-type base region and that of the accumulation layer that appears in the surface layer of the first-conductivity-type base layer are improved when a voltage is applied to the gate electrode.

In another preferred form of the invention, the second second-conductivity-type base region has a larger area than the first second-conductivity-type base region. In this case, an increased amount of carriers are injected from the second-conductivity-type emitter layer into the second second-conductivity-type base region, thus making it faster to switch the device to the thyristor mode.

According to another aspect of the present invention, there is provided an apparatus comprising: an active region for switching current; a peripheral region provided at a periphery of the active region; and a plurality of unit cells; wherein the active region includes the first and second second-conductivity-type base regions which are arranged in a pattern so as to face each other, and the peripheral portion includes an array of first second-conductivity-type base regions having respective first-conductivity-type source regions formed inside thereof, and surrounding the second second-conductivity-type base regions of the active region. The first main electrode is connected to surfaces of the first second-conductivity-type base regions of the peripheral portion. In this arrangement, carriers in the peripheral region surrounding the active region are absorbed by a large number of the first second-conductivity-type base regions during turn-off, whereby current concentration can be avoided.

In another preferred form of the invention, the peripheral region adjacent to the active region may be provided with an array of second-conductivity-type diverters which surround the second second-conductivity-type base regions of the active region, such that the first main electrode is connected to surfaces of the second-conductivity-type diverters. In this arrangement, carriers in the peripheral region for the active region are absorbed by the second-conductivity-type diverters connected to the first main electrode during turn-off, whereby current concentration can be avoided.

In a further form of the invention, the peripheral region adjacent to the active region may be provided with a second-conductivity-type bypass region which surrounds the second second-conductivity-type base regions of the active region, and is connected to the first second-conductivity-type base regions of the active region. In this arrangement, carriers in the peripheral region adjacent to the active region are absorbed by the second-conductivity-type bypass region connected to the first second-conductivity-type base regions of the active region, whereby current concentration can be avoided.

In a still further form of the invention, a second-conductivity-type bypass region that is connected to the first second-conductivity-type base regions of the active region is formed in a surface layer of a semiconductor substrate that is located below a large gate electrode pad for connecting a gate electrode to the gate electrode layer. In this arrangement, carrier in the peripheral region surrounding the active region are absorbed by the second-conductivity-type bypass region connected to the first second-conductivity-type base regions of the active region, whereby current concentration is prevented.

Preferably, the first-conductivity-type source region of the insulated gate thyristor has a width in a range of 0.5 $\mu$m to 2 $\mu$m. In this case, a potential difference due to carrier flowing under the first-conductivity-type source region is reduced, and a parasitic thyristor is less likely to latch up.

The first-conductivity-type base layer may have a trench formed at an end portion of the first-conductivity-type source region. The trench has a larger diffusion depth than the first-conductivity-type source region, and the first main electrode contacts with the first-conductivity-type source region at a side wall of the trench, and contacts with the first second-conductivity-type base region at a bottom wall of the trench. In this arrangement, the width of the first-conductivity-type source region can be reduced, while assuring a sufficiently larger contact area with the first main electrode.

In the insulated gate thyristor according to another aspect of the invention, a first-conductivity-type bypass region may provided in a second-conductivity-type emitter layer. In this case, the first-conductivity-type bypass region serves to discharge carriers during turn-off.

The diffusion depth of the first-conductivity-type bypass region may be smaller than the thickness of the second-conductivity-type emitter layer. In this case, the pn junction between the p emitter layer 1 and the n base layer 3 can be maintained, thus enabling carriers to be normally injected.

Preferably, at least one of the first and second second-conductivity-type base regions, the first-conductivity-type emitter region, the first-conductivity-type source region may have one of polygonal, circular and elliptical shapes. In this case, the semiconductor substrate can be utilized with increased efficiency, and the current flowing through the device can be uniformly distributed, assuring improved thermal balance.

In particular, the first second-conductivity-type base region and the first-conductivity-type source region in the surface layer thereof may be formed so as to surround the second second-conductivity-type base region, or a plurality of first second-conductivity-type base regions may be formed around the second second-conductivity-type base region. In these arrangements, the current flowing from the first-conductivity-type emitter region to the first-conductivity-type source region through the channel region is widely distributed, thus avoiding current concentration or localization.

In another preferred form of the invention, a plurality of first second-conductivity-type base regions and first-conductivity-type source regions in surface layers thereof are formed around the second second-conductivity-type base region, and the gate electrode layer having a generally annular shape is formed so as to surround the insulating film on the surface of the second second-conductivity-type base region, the first main electrode being located on the side of the gate electrode layer opposite to the second second-conductivity-type base region, with the insulating film interposed between the gate electrode layer and the first main electrode. In this arrangement, an accumulation layer is formed in a surface layer of the first-conductivity-type semiconductor layer located below the gate electrode, and the ON-state voltage is reduced.

Preferably, a contact portion between the first main electrode, and the first second-conductivity-type base region and the first-conductivity-type source region has one of a polygonal, circular and elliptical shape. In this case, the semiconductor substrate can be utilized with increased efficiency, and the current flowing through the device can be uniformly distributed, assuring improved thermal balance.

In a further preferred form of the invention, a first portion of a surface of the first-conductivity-type source region that is close to the second second-conductivity-type base region is covered with the insulating film, and a second portion of the surface remote from the second second-conductivity-type base region is in contact with the first main electrode. In this arrangement, current flowing from the first-conductivity-type emitter region into the first-conductivity-type source region through the inversion channel right under the gate electrode does not flow through a portion close to the first-conductivity-type emitter region, thus reducing the possibility of latch-up of a parasitic thyristor. Further, the breakdown voltage of the device is increased with a decrease in the limit current due to an effect of ballast resistance.

The insulated gate thyristor may include a first portion in which the first and second second-conductivity-type base regions face each other, and a second portion in which two first second-conductivity-type base regions face each other. In this case, an amount of carriers injected from the first-conductivity-type source region is increased, and the device can be quickly switched to the thyristor mode, with a result of reduction in the ON-state voltage.

Also, lifetime killers may be present in local portions of the insulated gate thyristor. In this case, the lifetime distribution of carriers can be optimally controlled, such that no lifetime killers are present in unnecessary portions, thus avoiding an increase in the ON-state voltage and other adverse influences.

The insulated gate thyristor may further include a first-conductivity-type buffer layer formed between the first-conductivity-type base layer and the second-conductivity-type emitter layer, the first-conductivity-type buffer layer having a higher impurity concentration than the first-conductivity-type base layer. In this case, the first-conductivity-type buffer layer having a high impurity concentration serves to prevent a depletion layer from spreading, thus making it possible to reduce the thickness of the first-conductivity-type base layer. This structure is suitably employed in a high-voltage insulated gate thyristor.

The first-conductivity-type source region may consist of two regions having different impurity concentrations, and the first main electrode may contact with the surface of the region having the higher impurity concentration. In particular, a first portion of the first-conductivity-type source region which faces the first-conductivity-type emitter region has a relatively high impurity concentration, and a second portion of the first-conductivity-type source region which faces the adjacent first-conductivity-type source region has a relatively low impurity concentration. In this case, the ON-state voltage can reduced during operation of the thyristor.

BRIEF DESCRIPTION OF THE DRAWINGS

The invention will be described in greater detail with reference to preferred embodiments thereof and the accompanying drawings, wherein.

DETAILED DESCRIPTION OF THE PREFERRED EMBODIMENTS

In the process of developing the EST to produce prototypes of various insulated gate thyristors, in an attempt to solve the above-described problems, the inventors of the present invention found that there is no need to contact the first main electrode with the second second-conductivity-type base region, and that even if the surface of the second second-conductivity-type base region is covered with an insulating film, the resulting device can be switched to the thyristor mode, assuring a good trade-off characteristic between the ON-state voltage and the turn-off time. The inventors also made a further analysis on patterns as viewed in the plane of the devices and impurity concentrations.

As a result of the analysis, it was found that the withstand voltage characteristic and ON-state voltage are improved by varying the diffusion dimensions and impurity concentrations of the first and second second-conductivity-type base regions. It was also found that the device is given improved characteristics by each of the following measures: varying the thickness of the gate insulating film, varying the width of the first-conductivity-type source region, and providing a trench, for example.

The first and second second-conductivity-type base regions may be in the form of stripes that extend in parallel with each other, or may have a polygonal, circular or elliptical shape. If the first second-conductivity-type base region is disposed so as to surround the second second-conductivity-type base region, the current concentration can be reduced or avoided, and thus the device provides an improved trade-off characteristic. A plurality of first second-conductivity-type base regions may be advantageously formed around the second second-conductivity-type base region. It is also advantageous to vary the diffusion depth of the first-conductivity-type emitter region, and to provide lifetime killers in local areas of the thyristor.

Figure 39:
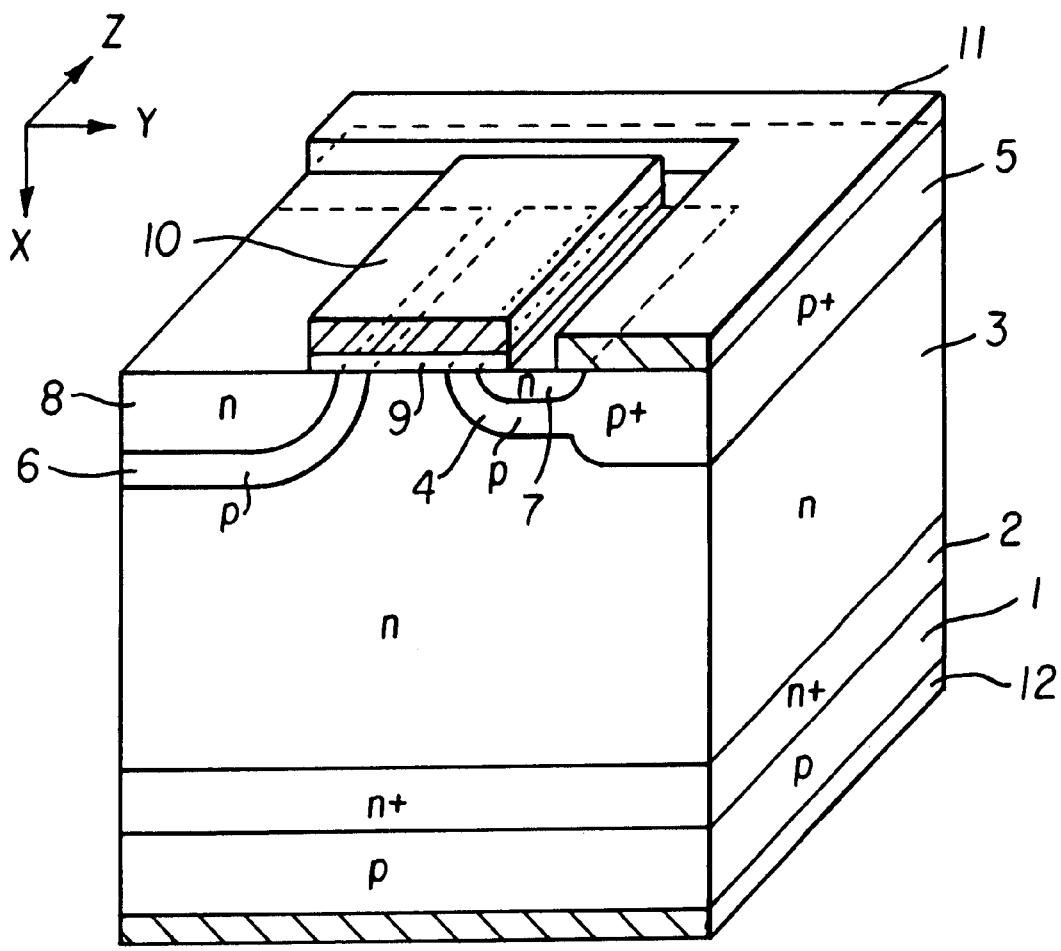
FIG. 39 is a perspective view showing an EST cut in a unit cell.

Some embodiments of the present invention will be now described, referring to the drawings in which the same reference numerals as used in FIG. 39 are used to identify structurally and/or functionally corresponding elements. In the following description, "n" or "p" prefixed to a region or layer means that the relevant region or layer has electrons or holes, respectively, as majority carriers. While the first conductivity type is n type and the second conductivity type is p type in the following embodiments, the first and second conductivity types may be reversed, namely, may be p type and n type, respectively.

First Embodiment

Figure 1:
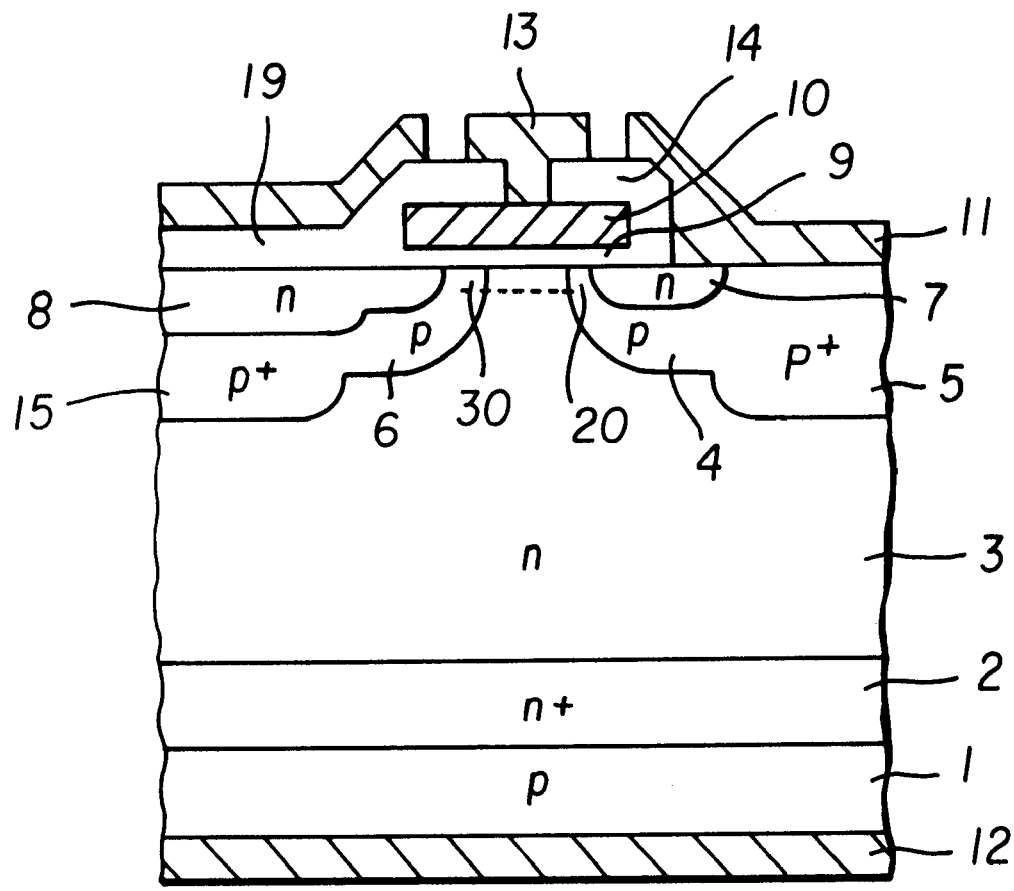
FIG. 1 is a cross-sectional view showing a part of an insulated gate thyristor according to the first embodiment of the present invention.

FIG. 1 is a cross-sectional view showing a unit cell of an insulated gate thyristor according to the first embodiment of the present invention. A multiple of unit cells, each of which is constructed as shown in FIG. 1, are arranged while being repeatedly inverted, to constitute a semiconductor device. The insulated gate thyristor of FIG. 1 has a semiconductor substrate portion which is similar in construction to that of the EST of FIG. 39. Specifically, a first p base region 4 and a second p base region 6 are formed in a surface layer of an n base layer 3 having a relatively high resistivity, on the side of one of opposite major surfaces thereof, such that these base regions 4, 6 are spaced apart from each other. Further, first $p^+$ well region 5 and second $p^+$ well region 15 having a larger diffusion depth than the first and second p base regions 4, 6 are formed in respective parts of the first p base region 4 and second p base region 6, so as to avoid latch-up of parasitic thyristor. A p emitter layer is formed on an $n^+$ buffer layer 2, which is in turn formed on the other major surface of the n base layer 3. An n source region 7 is formed in a selected portion of a surface layer of the first p base region 4, and an n emitter region 8 is formed in a selected portion of a surface layer of the second p base region 6. As in the thyristor of FIG. 39, a gate electrode layer 10 made of polycrystalline silicon is formed on a gate oxide film 9 over surfaces of the first p base region 4, n base region 3 and the second p base region 6, which surfaces are interposed between the n source region 7 and the n emitter region 8. Thus, an n-channel lateral MOSFET is provided. One surface of the gate electrode layer 10 which does not face the first and second base regions 4, 5 and n base layer 3 is covered with an insulating film 14 made of phosphorous glass (PSG), or the like, and contact holes are formed through the insulating film 14 such that a cathode electrode 11 contacts with surfaces of both of the first p base region 4 and the n source region 7, and such that a gate electrode 13 contacts with the gate electrode layer 10. An insulating film 19 is also provided for covering the surface of the n emitter region 8. An anode electrode 12 is formed on one of opposite surfaces of the p emitter layer 1 remote from the n+ buffer layer 2. The gate electrode 13 does not necessarily contact with the portion of the gate electrode layer 10 between the second p base region 6 and the first p base region 4 as illustrated in FIG. 1, but may contact with any other portion of the gate electrode layer 10.

Figure 2A:
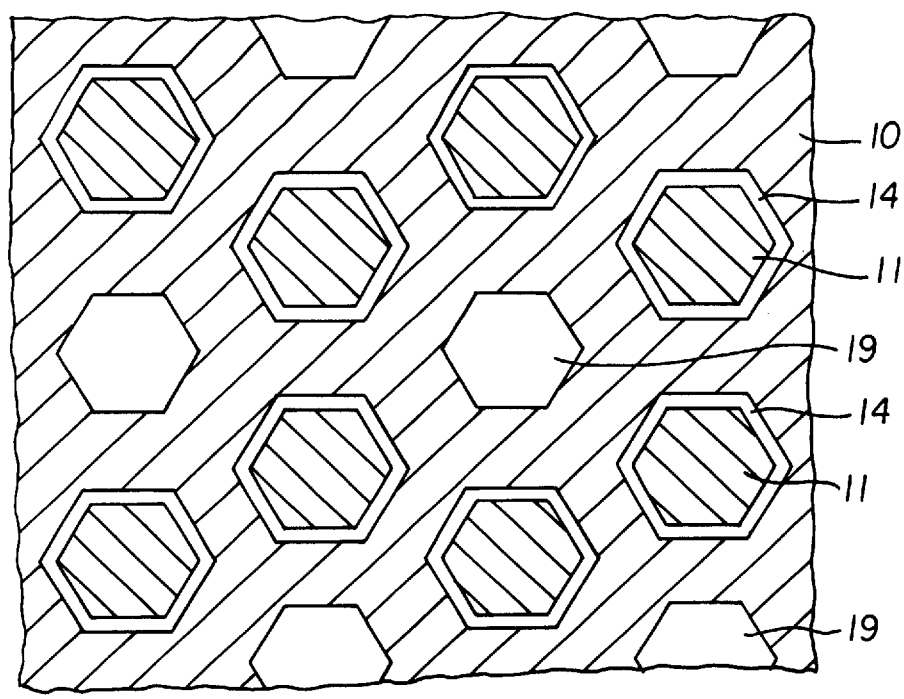
FIG. 2(a) is a cross-sectional view showing a horizontal plane that passes the middle of a gate electrode layer of the insulated gate thyristor of the first embodiment.

FIG. 2(a) is a cross-sectional view taken in a horizontal plane that passes the middle of the gate electrode layer of the insulated gate thyristor of the first embodiment. The same reference numerals as used in FIG. 1 are used to identify the corresponding elements. FIG. 2 shows a pattern in which a hexagonal insulating film 19 is disposed within a mesh-like gate electrode layer 10, and hexagonal cathode electrodes 11 surrounded by insulating films 14 are arranged around the insulating film 19. This pattern is repeated such that each of a plurality of insulating films 19 is surrounded by six cathode electrodes 11, Each of the cathode electrodes 11 has a hexagonal shape in the cross section of FIG. 2(a). In the actual device, however, the cathode electrode 11 often extends over the gate electrode layer 10 with the insulating film 14 formed therebetween.

Figure 2B:
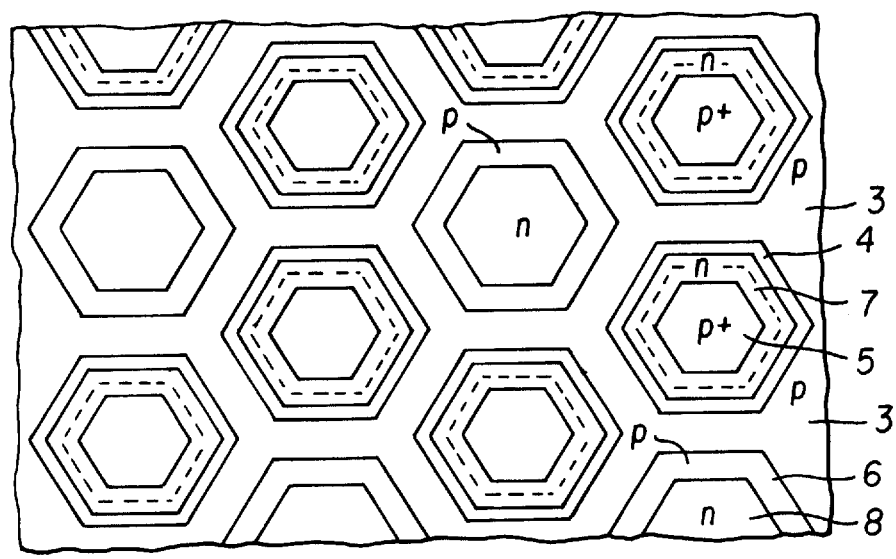
FIG. 2(b) is a plan view showing the surface of a silicon substrate of the thyristor.

FIG. 2(b) is a pin view showing respective diffusion regions formed in a surface of a silicon substrate of the insulate gate thyristor of FIG. 1, from which insulating films and electrodes are removed. In FIG. 2(b), emitter regions 8 are located in portions of the silicon substrate right under the hexagonal insulating films 19 shown in FIG. 2(a), and each of the emitter regions 8 is surrounded by second p base region 6. Areas bounded by dotted lines indicate portions of the silicon substrate which contact with the cathode electrodes 11. Each substrate portion that is in contact with the cathode electrode 11 includes generally annular n source region 7 having hexagonal outlines, and p+ well region 5 formed inside the n source region 7, and these regions 5, 7 are surrounded by first p base region 4. The n base layer 3 is exposed at its portions located between first p base regions 4 and second p base regions 6, and between two adjacent first p base regions 4. The first p base regions 4, second p base regions 6 and the exposed surface portion of the n base layer 3 are located under the gate electrode layer 10 of FIG. 2(a).

The insulated gate thyristor of (he first embodiment may be produced in substantially the same process in which the conventional IGBT is produced, using different masks for forming respective diffusion regions. To produce a sample of 600V-class device, for example, about 10 μm-thickness n layer having a resistivity of 0.1 Ω.cm and providing the n+ buffer layer 2, and about 60 μm-thickness n layer having a resistivity of 40 Ω.cm and providing the n base layer 3 were epitaxially grown on 450 μm-thickness p type silicon substrate having a resistivity of 0.02 Ω.cm, so as to provide an epitaxial wafer. The p+ well region 5, second p+ well region 15, first and second p base regions 4 and 6, and p emitter layer 1 were formed by implantation of boron ions and thermal diffusion, and the n emitter region 8 and n source region 7 were formed by implantation of arsenic ions and phosphorus ions and thermal diffusion. The first p base region 4, second p base region 6, n source region 7 and n emitter region 8 were formed using as masks the polycrystalline-silicon gate electrode layer 10 and others on the semiconductor substrate, with their edges determined by patterns of the masks, and spacings between these regions 4, 6, 7 and 8 were determined by diffusion of the respective ions in the lateral directions, The cathode electrode 11 and gate electrode 13 were formed by sputtering of Al alloy and subsequent photolithography, and the anode electrode 12 to be soldered to a metallic substrate was formed by laminating three layers of Ti, Ni and Au by sputtering. The device was irradiated with helium ions, to control the lifetime of carriers so as to reduce the switching time. By irradiating the device with helium ions, crystal defects which produce lifetime killers can be localized. The conditions for irradiation of helium ions were such that the accelerating voltage was 24 MeV, and the dose amount was in the range of $1\times10^{11}$ to $1\times10^{12}$ cm$^{-2}$. After the irradiation, the device was annealed at 350 to 375° C.

The diffusion depth of the p+ well region 5 and second p+ well region 15 was 6 μm, and that of the first and second p base regions 4, 6 was 3 μm. The diffusion depths of the n emitter region 8 and n source region 7 were 2 μm and 0.4 μm, respectively. With the diffusion depth of the respective regions thus controlled, the current amplification factor of the npn transistor of the thyristor portion was increased, and the ON-state voltage was reduced. The portion of the n emitter region 8 close to the first p base region 4 had substantially the same diffusion depth as the n source region 7, with the breakdown voltage taken into consideration. The width of the gate electrode 10 was 15 μm, and the widths of the n source region 7 and n emitter region 8 were about 4 μm and 6 μm. The cell pitch was about 30 μm.

The operation of the insulated gate thyristor constructed as described above will be now described. When the cathode electrode 11 is ground, and a positive voltage that is equal to or greater than a certain value (threshold) is applied to the gate electrode 13 while a positive voltage is applied to the anode electrode 12, an inversion layer (partial accumulation layer) is formed below the gate electrode layer 10, and the lateral MOSFET is turned on, As a result, electrons are initially supplied from the cathode electrode 11 to the n base layer 3, through the n source region 7, and the channel of the MOSFET formed in the surface layer of the first p base region 4. These electrons function as base current for a pnp transistor which consists of the p emitter layer 1, n+ buffer layer 2, n base region 3, and the p base region 4 (p+ well region 5), and this pnp transistor operates in the IGBT mode. At the same time, holes are injected from the p emitter layer 1, and flow into the first p base region 4, through the n+ buffer layer 2 and the n base layer 3. Since the second p base region 6 is in the floating state in this mode, its potential is gradually increased due to the hole current flowing through the n base layer 3. As is understood from the cross-sectional view of FIG. 1, when the transistor is on, the potential of thee n emitter region 8 is kept substantially equal to that of the n source region 7 through the channel of the MOSFET, and therefore electrons begin to be injected from the n emitter region 8 into the second p base region 6 after a while. Thus, a thyristor portion consisting of the p emitter layer 1, n+ buffer layer 2, n base layer 3, second p base region 6 and the n emitter region 8 operates in the thyristor mode. In contrast with the thyristor portion, the four-layer structure consisting of the p emitter layer 1, n+ buffer layer 2 and n base layer 3, first p base region 4, and n source region 7 may be called IGBT portion.

Upon turn-off, the potential of the gate electrode layer 10 is lowered below the threshold of the lateral MOSFET, to turn off the lateral MOSFET, so that the n emitter region 8 is electrically cut off from the cathode electrode 11, and the operation of the thyristor portion is thus stopped.

In the insulated gate thyristor of FIG. 1, the surfaces of both of the second p base region 6 and n emitter region 8 are covered with the insulating film 19, and the second p base region 6 is not in contact with the cathode electrode 11, When the transistor is turned on, therefore, the potential of the n emitter region 8 is kept substantially equal to that of the cathode electrode 11, through the channel formed fight under the gate electrode layer 10. As a result, the potential of the second p base region 6 is gradually increased due to the hole current flowing through the n base layer 3, until electrons begin to be injected from the n emitter region 8, whereby the thyristor consisting of the n emitter region 8, second p base region 6, n base layer 3 and p emitter layer 1 is turned on. Thus, the IGBT node am be quickly switched to the thyristor mode, without requiring the hole current flowing in the Z direction in the second p base region as in the conventional EST shown in FIG. 39. Also, the ON-state voltage is lowered since the electrons are uniformly injected from the entire n emitter region Upon turn-off the pn junction between the n emitter region 8 and the second p base region 6 can uniformly resume its reverse-blocking ability, whereby current localization or concentration 6 can be avoided, assuring a significantly increased reverse bias safe operation area (RBSOA). Further, since a plurality of first p base regions 4 having the n source regions 7 in their surface layers are located around a second p base region 6 in the pattern as shown in FIG. 2(b), the device of this embodiment is free from current concentration or localization, and provides a sufficiently high breakdown voltage.

In the insulated gate thyristor of FIG. 1, the channel region formed right under the gate electrode layer 10 includes a first channel region 20 that consists of a surface layer of the first p base region 4 interposed-between the n source region 7 and the n base layer 3, and a second channel region 30 that consists of a surface layer of the second p base region 6 interposed between the n emitter region 8 and (lie n base layer 3. In the present embodiment, the width of the first channel region 20 is controlled to be smaller than that of the second channel region 30. For example, the first channel region 20 has a width of 1.2 Min, and the second channel region 30 has a width of 2 $\mu$m. By reducing the width of the first channel region 20 as described above, the channel resistance of this region 20 is reduced, and the ON-state voltage of the insulated gate thyristor can be thus reduced. Also, the amount of electrons supplied from the n source region 7 is increased in the initial period after turn-on, and therefore the amount of holes injected from the p emitter layer 1 is also increased, whereby the device can be quickly switched to the thyristor mode, with a result of reduction in the ON-state voltage.

Figure 40:
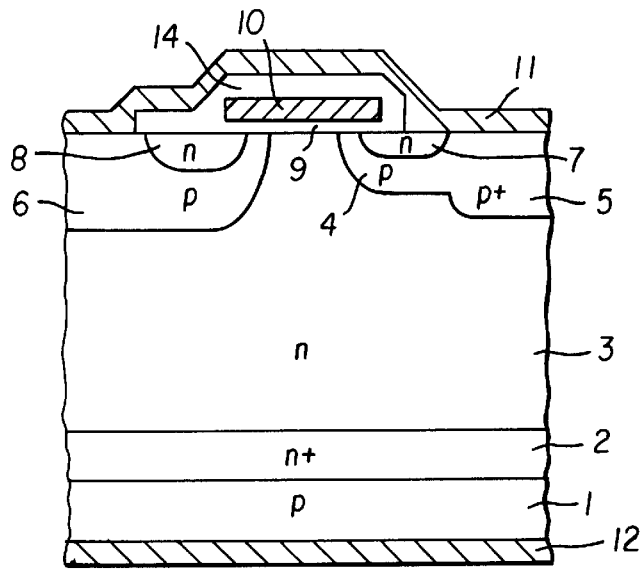
FIG. 40 is a cross-sectional view showing an improved EST.
Figure 41:
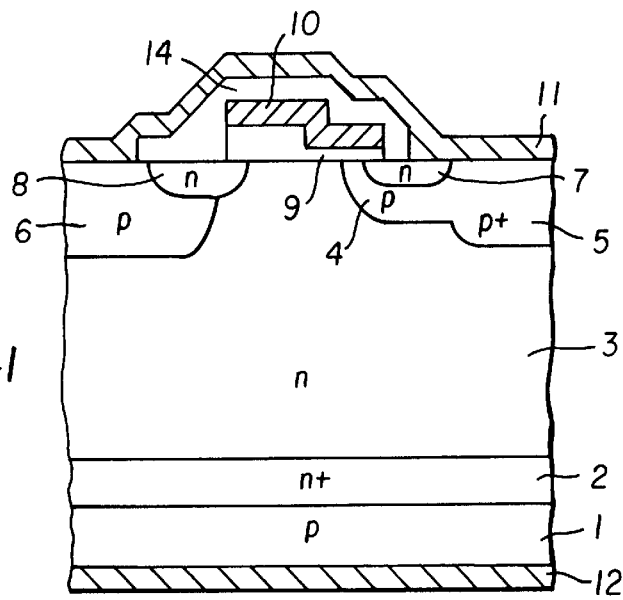
FIG. 41 is a cross-sectional view showing another improved EST.
Figure 42:
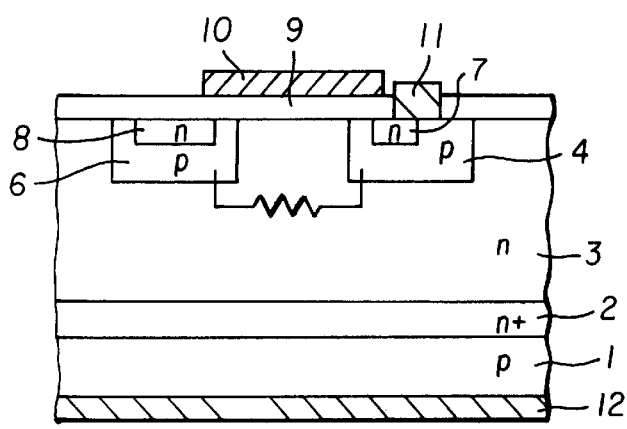
FIG. 42 is a cross-sectional view showing a FET controlled thyristor.

Using the same epitaxial wafer as used in the first embodiment, 2500V-class devices were produced which includes EST-1 as shown in FIG. 39, EST-2 as shown in FIG. 40, EST-3 as shown in FIG. 41 and IGBT. The n emitter region 9 of both of EST-2 and EST-3 had a width of 20 $\mu$m. All of the devices had a chip size of 1 cm$^1$. When the lifetime of carriers was controlled in the same manner in the first embodiment and the above four types of devices, the ON-stage voltage, which was defined by a fall of the potential measured during conduction of current of 100A.cm$^2$, was 0.8V for the insulated gate thyristor of the first embodiment, 1.6V for EST-1, 1.7V for EST-2, 1.0V for EST-3, and 2.3V for the IGBT.

Figure 3:
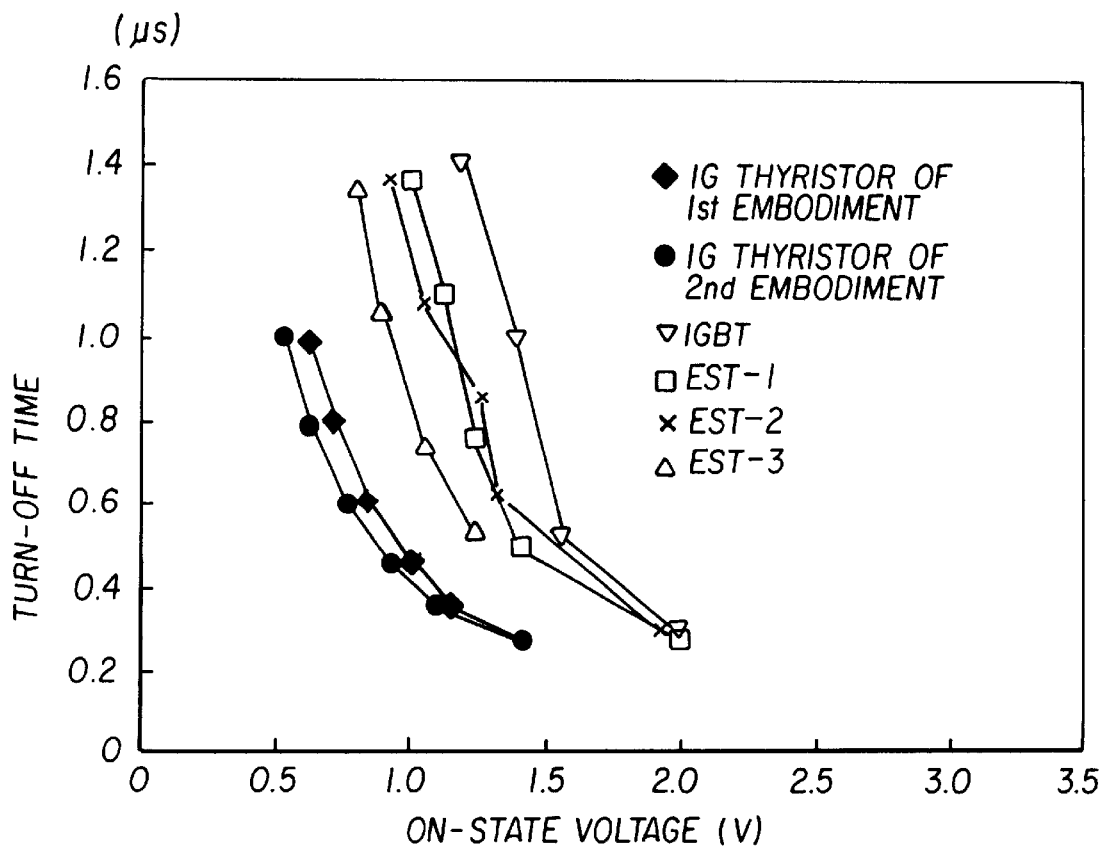
FIG. 3 is a graph showing the trade-off characteristic between the ON-state voltage and the turn-off time of 600 V-class devices of the first embodiment and comparative examples.

The graph of FIG. 3 shows a trade-off characteristic between the ON-state voltage and the turn-off time of the insulated gate thyristor of the first embodiment shown in FIG. 1, and those of EPT-1, EST-2, EST-3 and IGBT as comparative examples. The horizontal axis indicates the ON-state voltage, and the vertical axis indicates the turn-off time, The ON-state voltage was defined by a fall of potential at 25° C. during conduction of current of 100A-CM2. The turn-off time was measured at 125° C. It is understood from FIG. 3 that the insulated gate thyristor of the first embodiment exhibited a better trade-off characteristic than EST-1, EST-2, EST-3 and IGBT.

The improvement in the trade-off characteristic is a consequence of reduction in the channel resistance achieved by reducing the width of the first channel region 20, and resulting reduction in the ON-state voltage of the insulated gate thyristor. In particular, the lifetime of carriers is controlled by injection of helium ions, so that crystal defects that produce lifetime killers are localized, and the distribution of the lifetime killers is optimized, whereby the lifetime killers are not present in unnecessary portions. This leads to a further improved trade-off characteristic between the ON-state voltage and the turn-off time.

While the insulated gate thyristor constructed as shown in FIG. 1 is formed in the hexagonal pattern as shown in Figs. 2(a) and 2(b), the thyristor having the same structure may be formed in a rectangular or other polygonal pattern, circular or oval pattern, and various other patterns. Also, the first p base region may be disposed so as to surround the second p base region.

Second Embodiment

Figure 4:
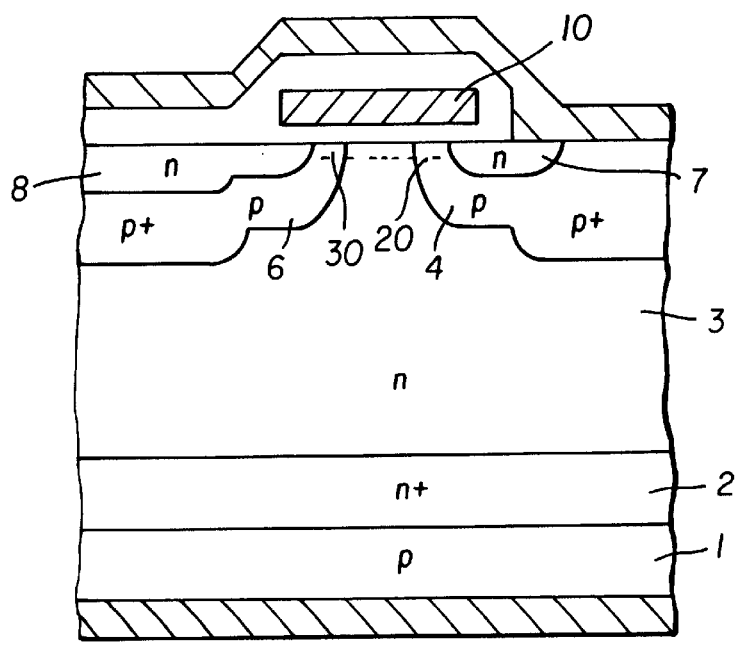
FIG. 4 is a cross-sectional view of a part of an insulated gate thyristor according to the second embodiment of the present invention.
Figure 6:
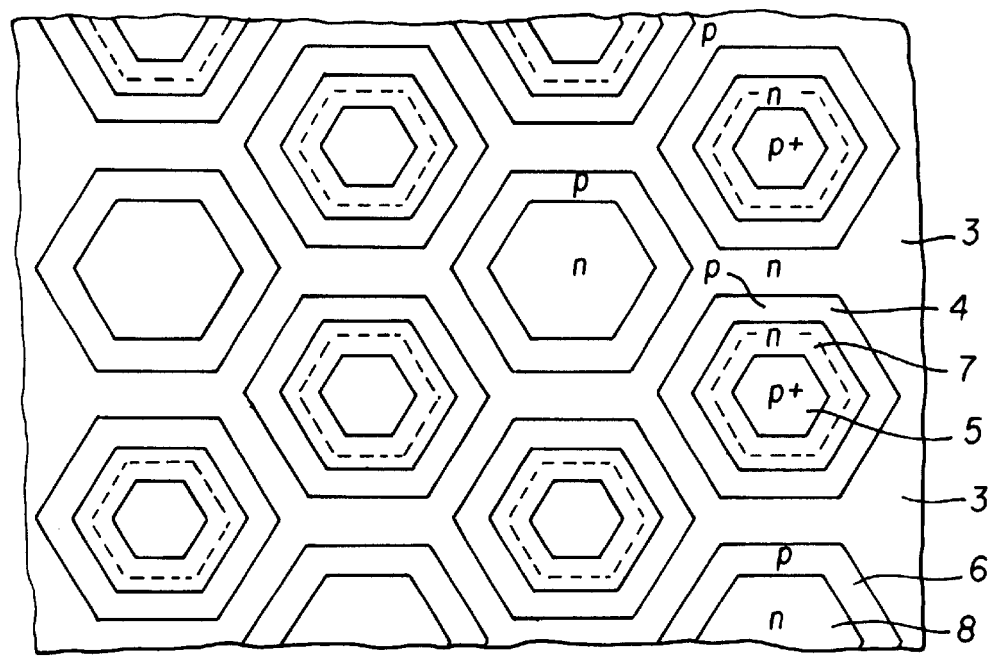
FIG. 6 is a plan view showing the surface of a silicone substrate of the insulated gate thyristor of the second embodiment.

FIG. 4 is a cross-sectional view of a part of an insulated gate thyristor according to the second embodiment of the present invention, The basic construction of the second embodiment is the same as that of the first embodiment of FIG. 1. In the second embodiment, however, the width of the first channel region 20 interposed between the n source region 7 and the n base layer 3 fight under the gate electrode layer 10 is substantially equal to the width of the second channel region 30 interposed between the n emitter region 8 and the n base layer 3, FIG. 6 is a plan view showing respective diffusion regions formed in the surface of the silicon substrate from which insulating films and electrodes are removed. Although not illustrated in the figures, the first channel region 20 and the second channel region 30 have different impurity concentrations. For example, the amounts of boron ions implanted to form the first p base region 4 and the second p base region 6 are $5\times10^{13}$ cm$^{-2}$, and $1\times10^{14}$ cm$^{-2}$, respectively. Thus, the amount of ions implanted for forming the first p base region 4 is about one half of that for forming the second p base region 6. The heat treatment after ion implantation is conducted at 1150° C. for 90 min. for both of the first and second p base regions. There is no significant difference between the diffusion depths of the first p base region 4 and second p base region 6.

By reducing the impurity concentration of the first channel region 20 as described above, the channel resistance of the first channel region 20 is reduced when a voltage is applied to the gate electrode layer 10, and the ON-state voltage of the resulting insulated gate thyristor can be reduced. Also, the amount of electrons supplied from the n source region 7 is increased in the initial period after turn-on, and therefore the amount of holes injected from the p emitter layer 1 is do increased, whereby the device can be quickly switched to the thyristor mode, with a result of reduction in the ON-state voltage. No influences due to the difference in the impurity concentration were observed on the capability to withstand high voltage, breakdown voltage, and other characteristics.

A trade-off characteristic between the ON-state voltage and the turn-off time measured with respect to the insulated gate thyristor of the second embodiment was found to be substantially the same as that of the first embodiment, and better than those of ESTs and IGBT.

Third Embodiment

Figure 5:
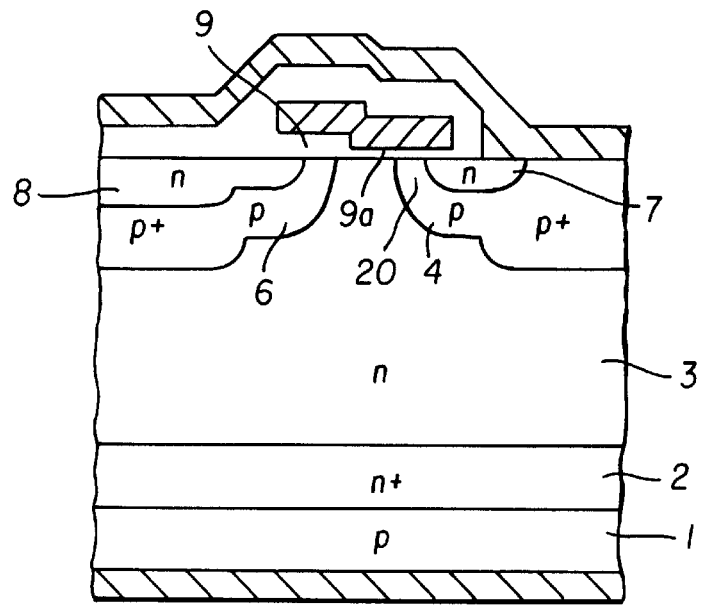
FIG. 5 is a cross-sectional view of a part of an insulated gate thyristor according to the third embodiment of the present invention.

FIG. 5 is a cross-sectional view of a part of an insulated gate thyristor according to the third embodiment of the present invention. A hexagonal pattern similar to that of FIG. 6 is employed as a planar pattern of this embodiment. The third embodiment is different from the first embodiment in that the thickness of the gate oxide film 9 varies from portion to portion, In FIG. 5, a portion of the gate oxide film 9 located above the second p base region 6 and a part of the n base region 3 has the same thickness (of 0.07 µm) as that of the gate oxide film 9 of the first embodiment. Another portion of the gate oxide film 9 located above the first p base region 4 and another part of n base layer 3 has a reduced thickness (of 0.05 µm).

In the insulated gate thyristor of the third embodiment, the resistance of the inversion layer appearing in the first channel region 20 and the resistance of the accumulation layer appearing in the surface layer of the n base layer 3 are reduced, and therefore an increased amount of electrons are supplied from the n source region 7 to the n emitter region 8. As a result, the amount of electrons injected from the n emitter region 8 into the second p base region 6 is increased, and therefore the ON-state voltage is reduced.

A trade-off characteristics between the ON-state voltage and the turn-off time measured With respect to the insulated gate thyristor of the third embodiment was found to be substantially the same as that of the first embodiment, and better than those of ESTs and IGBT.

Fourth Embodiment

Figure 7:
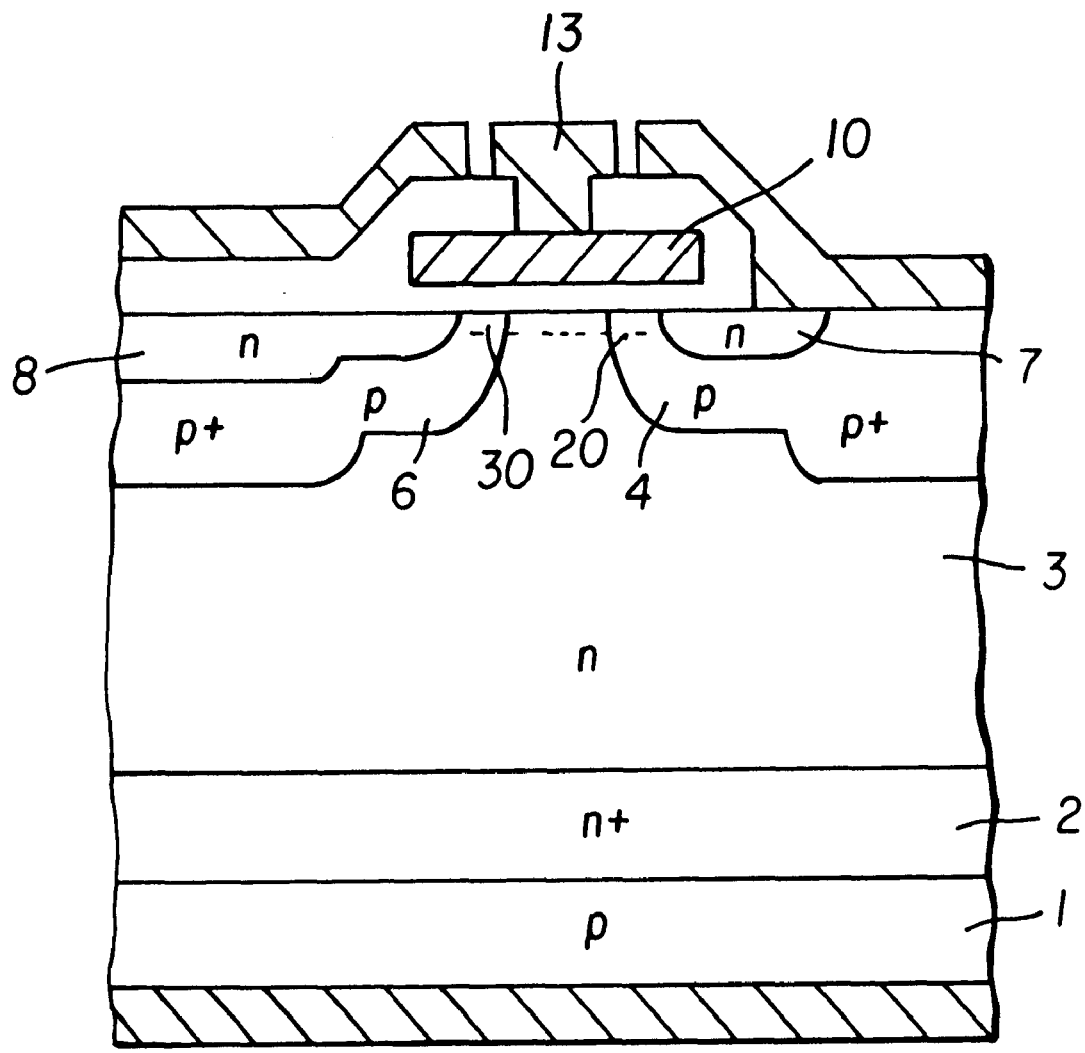
FIG. 7 is a cross-sectional view of a part of an insulated gate thyristor according to the fourth embodiment of the present invention.
Figure 8A:
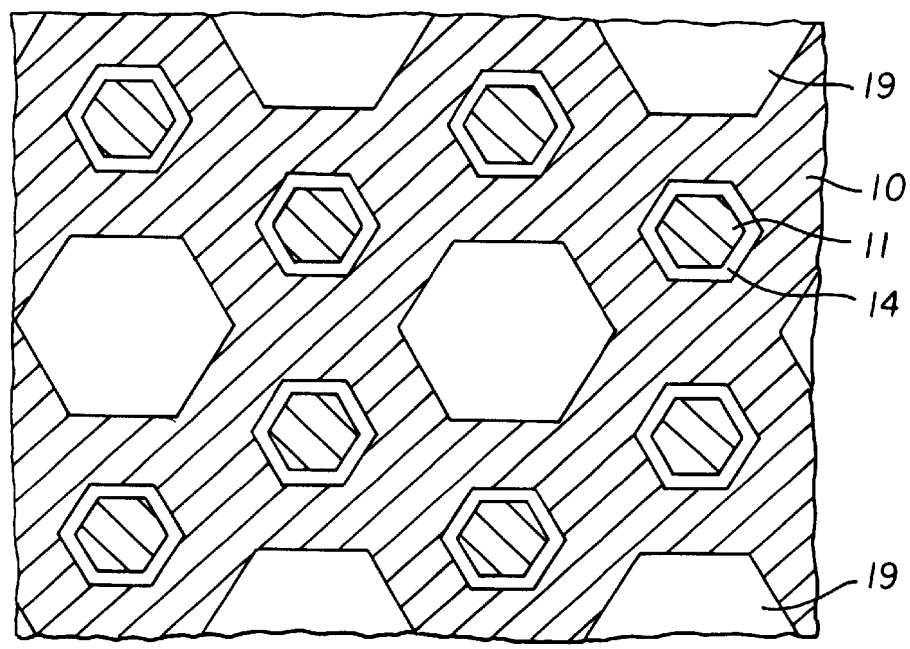
FIG. 8(a) is a cross-sectional view showing a horizontal plane that passes the middle of a gate electrode layer of the insulated gate thyristor of the fourth embodiment.
Figure 8B:
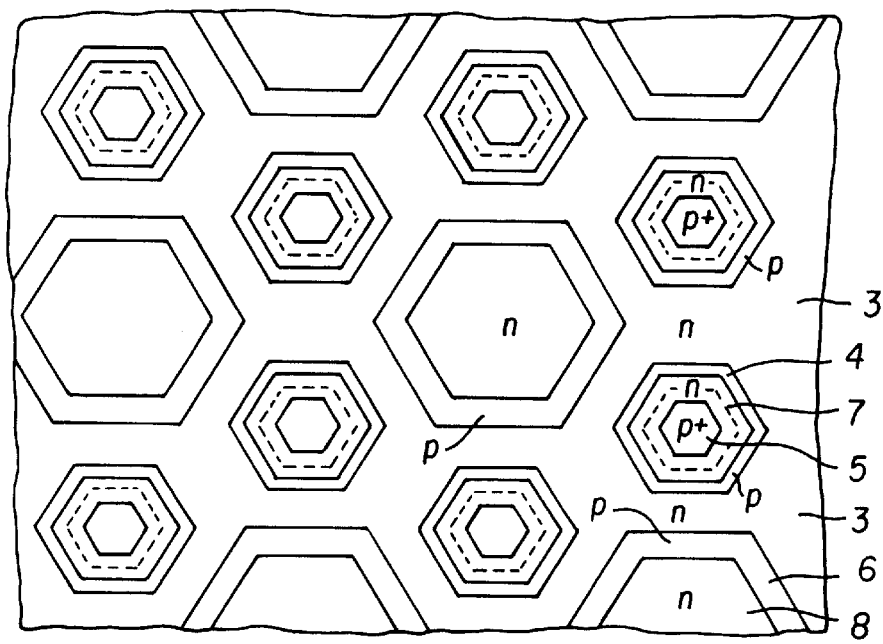
FIG. 8(b) is a plan view showing the surface of a silicon substrate of the thyristor.

FIG. 7 is a cross sectional view of a part of an insulated gate thyristor according to the fourth embodiment of the present invention. Similarly to the first embodiment of FIG. 1, the width of the first channel region 20 provided by the surface layer of the first p base region 4 interposed between the n source region 7 and the n base layer 3 is controlled to be smaller than the width of the second channel region 30 provided by the surface layer of the second p base region 6 interposed between the n emitter region, 8 and the n base layer 3. The fourth embodiment is different from the first embodiment in that the second p base region 6 is formed over a larger area of the silicon substrate than the first p base region 4. FIG. 8(a) is a horizontal cross-sectional view taken along a horizontal plane that passes the middle of the gate electrode layer of the insulated gate thyristor of the fourth embodiment, and FIG. 8(b) is a plan view showing respective diffusion regions formed in the surface of the silicon substrate of the insulated gate thyristor of FIG. 7 from which insulating films and electrodes are removed.

In FIG. 8(a), a pattern is repeated in which a hexagonal insulating film 19 is disposed within a mesh-like gate electrode layer 10, and hexagonal cathode electrodes 11 surrounded by insulating films 14 are arranged around the insulating film 19, as in the first embodiment of FIG. 2(a). As shown in FIG. 8(b), however, the second p base region 6 is formed over a larger area of the silicon substrate than the second p base region 4. For example, the distance between parallel lines of a hexagonal mask defining the width of the second p base region 6 is 40 µm, and the distance between parallel lines of a hexagonal mask defining the width of the first p ban region 4 is 16 µm. The n source region 7 has a width of about 4 µm and the n emitter region 8 has a width of about 18 µm. In this pattern, the width of the gate electrode layer 10 between the second p base region 6 and the corresponding first p base region 4 is different from that between adjacent first p base regions 4. For example, the width of the gate electrode layer 19 between the first and second p base regions 4, 6 is 15 µm, and the width of the layer 10 between the adjacent first p base regions 4 is 30 µm.

The graph of FIG. 3 also shows a trade-off characteristic between the ON-state voltage and the turn-off time of the insulated gate thyristor of the fourth embodiment. It is understood from FIG. 3 that the trade-off characteristic of the device of the fourth embodiment is better than that of the insulated gate thyristor of the first embodiment, as well as those of ESTs and IGBT.

The improvement in the trade-off characteristic is due to increases in the areas of the second p base region 6 and n emitter region 8, in addition to reduction in the channel resistance as in the first embodiment. With the areas of the second p base region 6 and n emitter region 8 thus increased, an increased amount of holes injected from the p emitter layer 1 to the n drift layer 3 are led to the thyristor portion, thus making it faster to switch the device to the thyristor mode, and the ON-state voltage of the insulated gate thyristor can be accordingly reduced.

Figure 9:
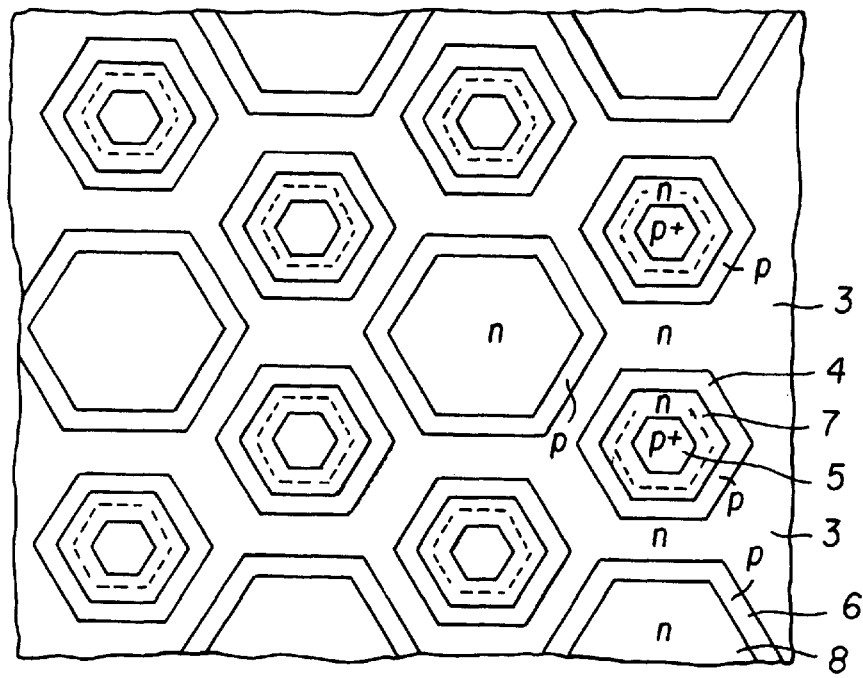
FIG. 9 is a plan view showing another hexagonal pattern.

A modified embodiment may be produced by controlling the impurity concentration of the first p base region 4 to be lower than that of the second p base region 6, and making the area of the second p base region 6 larger than that of the first p base region 4, while the width of the first channel region 20 as the surface layer of the first p base region 4 between the n source region 7 and the base layer 3 is made equal to the width of the second channel region 6 as the surface layer of the second p base region 6 interposed between the n emitter region 8 and the base layer 3. FIG. 9 is a plan view showing respective impurity diffusion regions formed in the surface of the silicon substrate in this modified embodiment.

Fifth Embodiment

Figure 10:
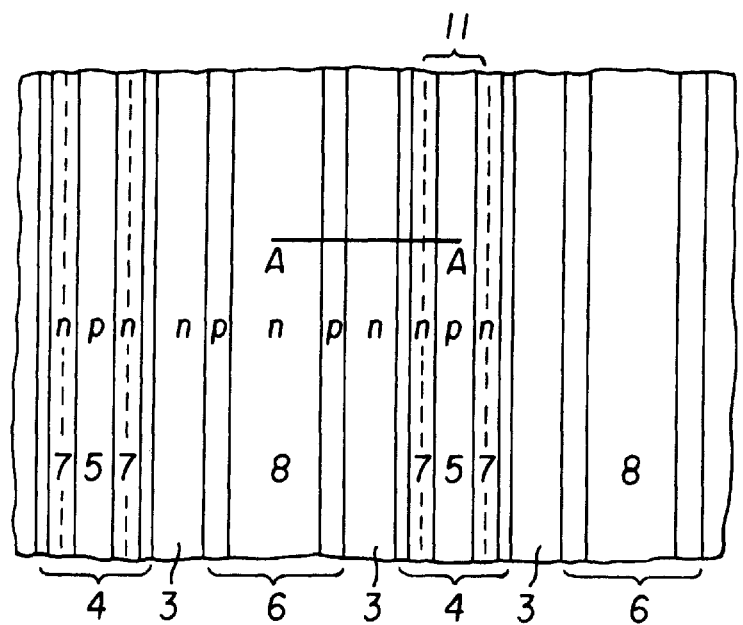
FIG. 10 is a plan view showing the surface of a silicon substrate of an insulated gate thyristor according to the fifth embodiment of the present invention.

FIG. 10 is a plan view showing respective diffusion regions formed in the surface of a silicon substrate of an insulated gate thyristor according to the fifth embodiment of the present invention, with insulating films and electrodes removed from the surface of the silicon substrate.

In this embodiment, first p base regions 4, n source regions 7 inside the first p base regions 4, second p base regions 6, and n emitter regions 8 inside the second p base regions 6 are all formed in the shape of parallel stripes. The corresponding first p base regions 4 and second p base regions 6 are separated by exposed surface portions of the n drift layer 3. The cathode electrode 11 is in contact with areas bounded by dotted lines, which extend over the n source regions 7 and p$^+$ well regions 5.

As shown in FIG. 10, the width of the first channel region 20 that is the surface layer of the first p base region 4 interposed between the n source region 7 and the n base layer 3 is smaller than the width of the second channel region 30 that is the surface layer of the second p base region 6 interposed between the n emitter region 8 and the n base layer 3. Also, the width of the second p base region 6 is larger than that of the first p base region 4, as in the fourth embodiment. Thus, the cross-sectional view taken along line A—A of FIG. 10 is substantially identical with that of FIG. 7.

The trade-off characteristic between the ON-state voltage and the turn-off time measured with respect to the insulated gate thyristor of the fifth embodiment is better than that of the insulated gate thyristor of the first embodiment, as well as those of ESTs and IGBT. This is because an increased amount of holes injected from the p emitter layer 1 into the n base layer 3 are led to the thyristor portion, due to the increases in the areas of the second p base region 6 and n emitter region 8, thus making it faster to switch the device to the thyristor mode, as in the fourth embodiment.

Sixth Embodiment

Figure 11:
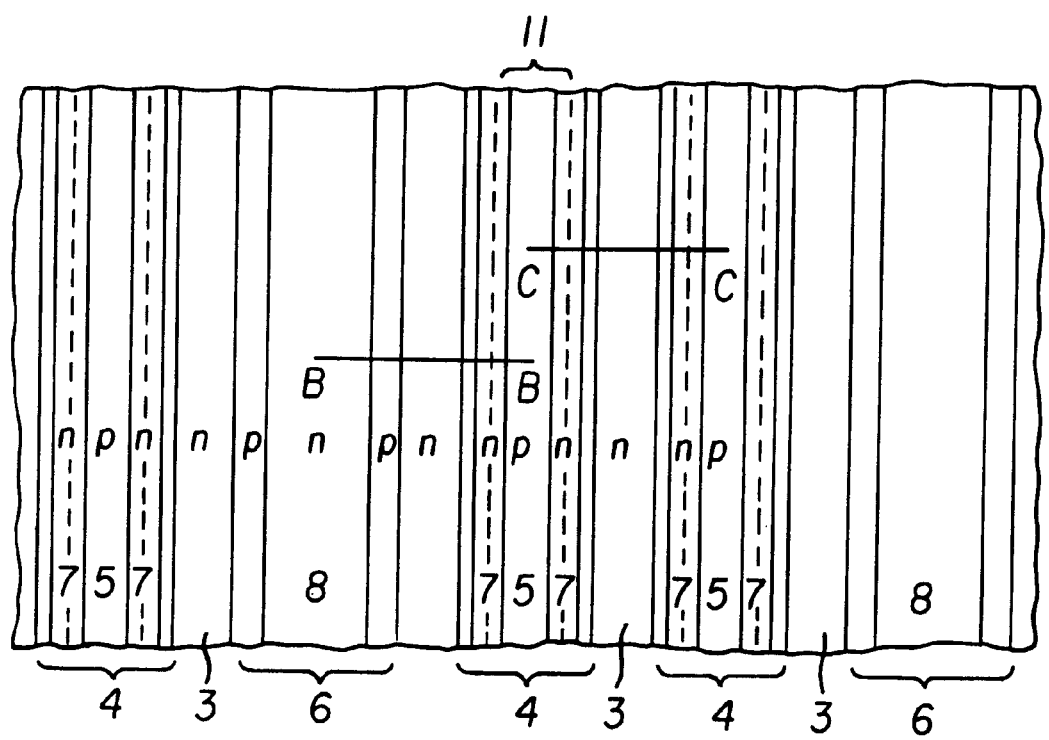
FIG. 11 is a plan view showing the surface of a silicon substrate of an insulated gate thyristor according to the sixth embodiment of the present invention.

FIG. 11 is a plan view showing respective diffusion regions formed in the surface of a silicon substrate of an insulated gate thyristor according to the sixth embodiment of the present invention, with insulating films and electrodes removed from the surface of the silicon substrate.

In this embodiment, first p base regions 4, n source regions 7 inside the first p base regions 4, second p base regions 6, and n emitter regions 8 inside the second p base regions are all formed in the shape of parallel stripes, as in the fifth embodiment, but the arrangement of these regions is different from that of the fifth embodiment. In the fifth embodiment, the first p base regions 4 and second p base regions 6 are alternately arranged in parallel with each other. In the sixth embodiment, on the other hand, two first p base regions 4 are successively formed between the second p base regions 6, thus forming a pattern in which the second p base region 6, first p base region 4, first p base region 4, and second p base region 6 are arranged in the order of description. The first p base regions 4 and second p base regions 6 are separated by exposed surface portions of the n base layer 3. The cathode electrode 11 is in contact with areas bounded by dotted lines, which extend over the n source regions 7 and p+ well regions 5.

Figure 12A:
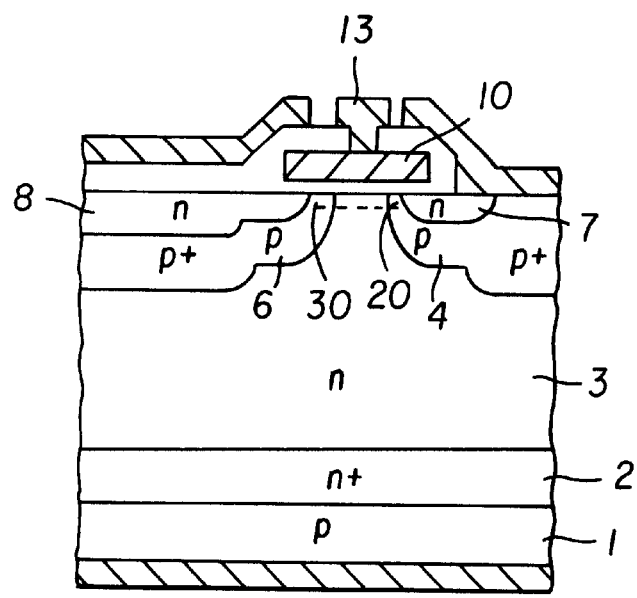
FIG. 12(a) is a cross-sectional view taken along line B—B of FIG. 11.
Figure 12B:
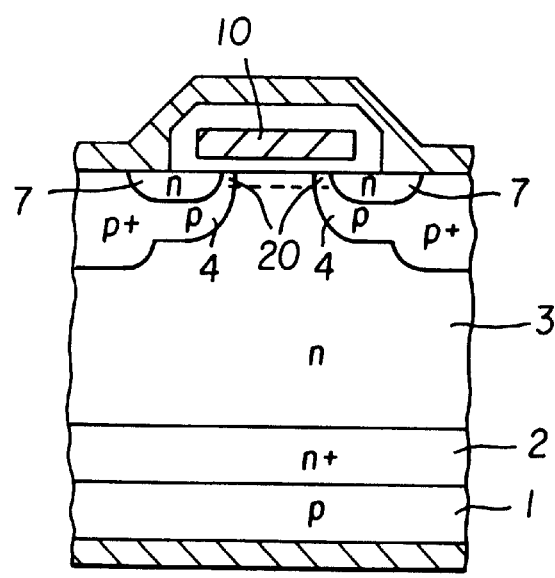
FIG. 12(b) is a cross-sectional view taken along line C—C of FIG. 11.

FIG. 12(a) is a cross-sectional view taken along line B—B of FIG. 11 which connects one emitter region 8 and one n source region 7. As in the fourth embodiment of FIG. 7, the width of the first channel region 20 is smaller than that of the second channel region 30, and the area of the second p base region 6 is larger than that of the first p base region 4. FIG. 12(b) is a cross-sectional view taken along line C—C of FIG. 11 which connects two n source regions 7. In this cross section, the first channel regions 20 in the respective first p base regions 4 face each other. in the cm or stripe pattern, the gate electrode layer 10 may be easily formed with the same width.

By increasing the IGBT portions as described above, an increased amount of electrons are supplied from the n source regions 7 in the initial period after turn-on, and therefore an increased amount of holes are injected from the p emitter layer 1, whereby the device can be more quickly switched to the thyristor mode.

The trade-off characteristic between the ON-state voltage and the turn-off time measured with respect to the insulated gate thyristor of the sixth embodiment is substantially the same as that of the fifth embodiment, and better than those of ESTs, IGBT and the device of the first embodiment.

Seventh Embodiment

Figure 13:
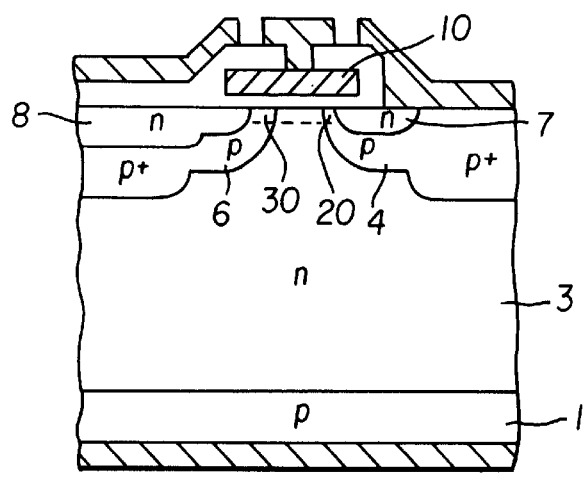
FIG. 13 is a cross-sectional view showing an insulated gate thyristor according to the seventh embodiment of the present invention.

While the n+ buffer layer 2 is provided between the p emitter layer 1 and the n base layer 3 in each of the devices of the illustrated embodiments, the present invention is equally applicable to a device having no n+ buffer layer. FIG. 13 is a cross-sectional view of a part of an insulated gate thyristor according to (lie seventh embodiment of the present invention, which is produced using a bulk silicon wafer, rather than an epitaxial wafer.

In this embodiment, the n base layer 3 is formed from a bulk silicon wafer having a resistivity of 200 Ω.cm and a thickness of 440 μm. While the structure on one of major surfaces (the upper side in FIG. 13) of this n base layer 3 is identical with that of the first embodiment of FIG. 1, the present embodiment differs from the first embodiment in that the p emitter layer 1 is directly formed on the other surface of the n base layer 3. As in the insulated gate thyristor of the first embodiment, the first channel region 20 interposed between the n source region 7 and the n base layer 3 right under the gate electrode layer 10 is controlled to be smaller than that of the second channel region 30 interposed between the n emitter region 8 and the n base layer 3. For example, the width of the first channel region is 1.2 82 m, and the width of the second channel region 30 is 2 μm. The hexagonal pattern as shown in FIG. 2 is employed as a planar pattern of this embodiment. The other dimensions, and the like, of this embodiment are almost equal to those of the insulated gate thyristor of the first embodiment. The gate electrode 13 does not necessarily contact with the portion of the gate electrode layer 10 between the second p base region 6 and the first p base region 4.

Using the same bulk wafer, 2500V-class devices of EST1, EST-2, EST-3 and IGBT were produced as comparative examples. The chip size of each of these devices was 1 cm². When the lifetime of carriers was controlled in the same manner, the ON-state voltages of these five devices, namely, that of the present embodiment, EST-1, EST-2, EST-3 and IGBT, were 1.0V, 2.0V, 2.2V, 1.4V, and 3.3V, respectively.

Figure 14:
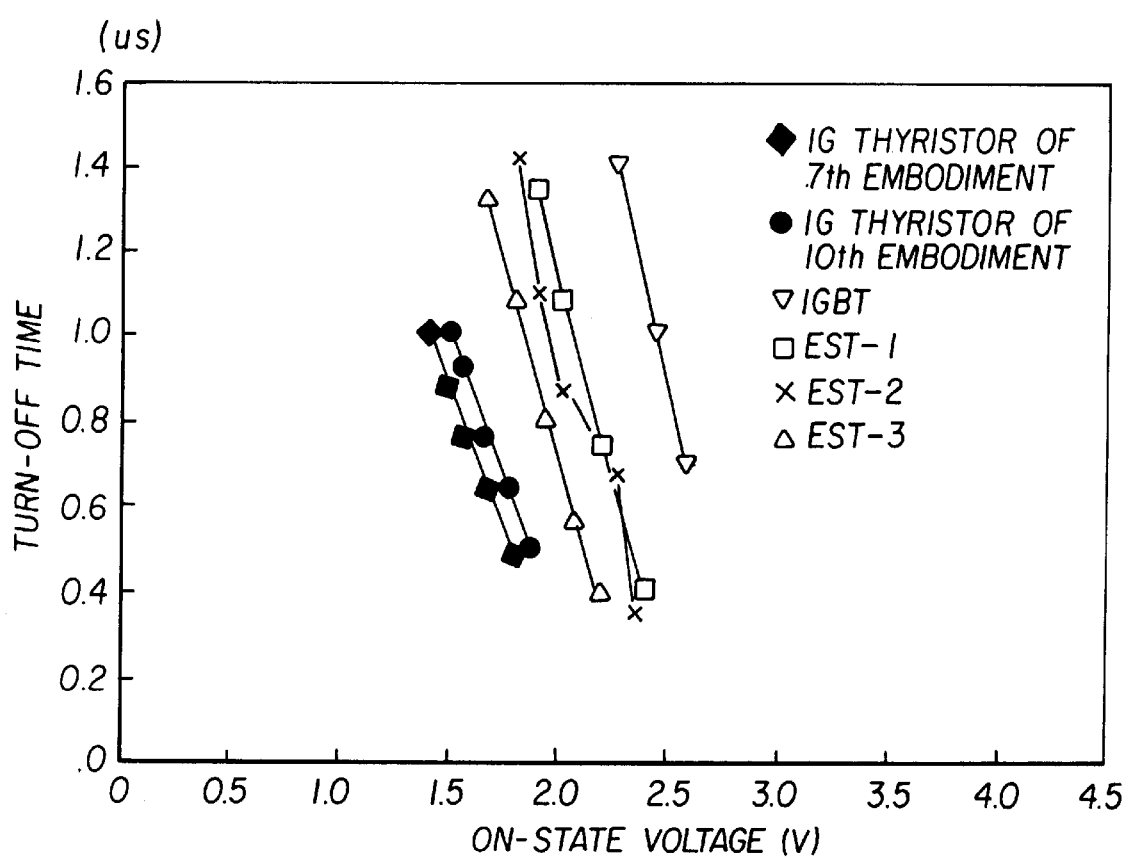
FIG. 14 is a graph showing the trade-off characteristic between the ON-state voltage and the turn-off time of 600 V-class devices of the seventh embodiment and comparative examples.

The graph of FIG. 14 shows trade-off characteristics between the ON-state voltage and turn-off time of the insulated gate thyristor of the seventh embodiment, and EST-1, EST-2, EST-3 and IGBT as comparative examples. The horizontal axis indicates the ON-state voltage, and the vertical axis indicates the turn-off time. The ON-state voltage was defined by a fall of the potential measured at 25° C. during conduction of 50A.cm$^{-2}$ current. The turn-off time was measured at 125° C.

It will be understood from the graph of FIG. 12 that the device of the seventh embodiment shows a better trade-off characteristic than ESTs and IGBT. With respect to 2500V-class devices using bulk wafers. The ON-state voltage of the insulated gate thyristor of the seventh embodiment is lower than those of ESTs and IGBT, as in the case of 600V-class devices using epitaxial wafers.

In the present embodiment, the cannel resistance is reduced by reducing the width of the first channel region 20, and the ON-state voltage of the resulting insulated gate thyristor can be reduced. Also, an increased amount of electrons are supplied from the n source region 7 in the initial period after turn-on, and therefore an increased amount of holes are injected from the p emitter layer 1, whereby the device can be quickly switched to (lie thyristor mode, with a result of reduction in (he ON-state voltage.

Thus, in the present embodiment, the ON-state voltage can be reduced without deteriorating other characteristics, regardless of the resistivity of the n base layer 3 and the current amplification factor of the pnp wide base transistor. In other words, the ON-state voltage can be effectively reduced according to the present invention, without depending upon the rated voltage of the device, and the method of producing the semiconductor crystal of the substrate.

Eighth Embodiment

Figure 15:
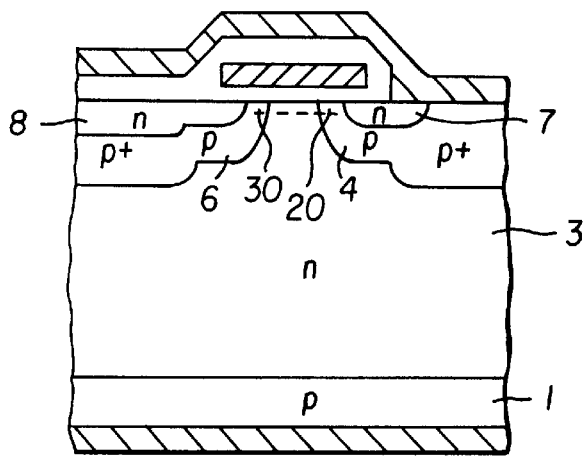
FIG. 15 is a cross-sectional view of a part of an insulated gate thyristor according to the eighth embodiment of the present invention.

FIG. 15 is a cross-sectional view showing an insulated gate thyristor according to the eighth embodiment of the present invention. Similarly to the seventh embodiment, the thyristor of the present embodiment is produced using a bulk wafer, rather than an epitaxial wafer, and the p emitter layer 1 is directly formed on the rear surface of the it base layer 3. A hexagonal pattern similar to that of FIG. 6 is employed as a planar pattern of this embodiment. As in the second embodiment of FIG. 4. The width of the first channel region 20 interposed between the n source region 7 and the n base layer 3 fight under the gate electrode layer 10 is substantially equal to the width of the second channel region 30 interposed between the n source region 8 and the n base layer 3, and the first channel region 20 has a lower impurity concentration than the second channel region 30. Namely, the dose amount of boron ions in the first channel region 20 is $5 \times 10^{13}$ cm, and the dose amount of boron ions in the second channel region 30 is $1 \times 10^{14} cm^{-2}$.

The trade-off characteristic between the ON-state voltage and the turn-off time measured with respect to the insulated gate thyristor of the eighth embodiment is substantially the saw as that of the seventh embodiment, and better than those of ESTs and EGBT.

This is because the channel resistance is reduced, and an increased amount of electrons are supplied from the n source region 7 in the initial period after turn-on, and therefore an increased amount of holes are injected from the p emitter layer 1, thereby making it faster to switch the transistor to the thyristor mode, as explained above with respect to the second embodiment.

Ninth Embodiment

Figure 16:
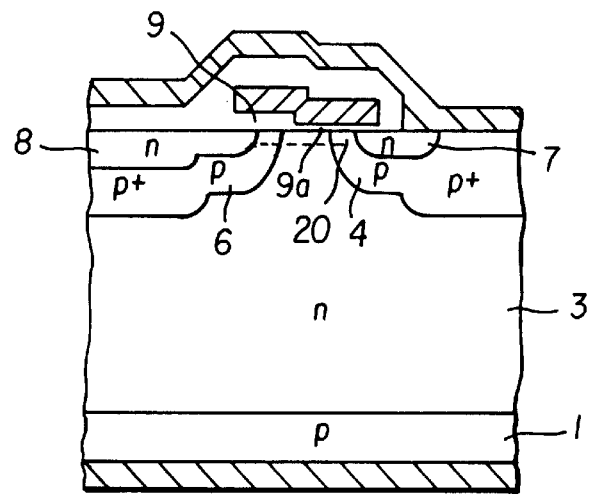
FIG. 16 is a cross-sectional view of a part of an insulated gate thyristor according to the ninth embodiment of the present invention.

FIG. 16 is a cross sectional view showing a part of an insulated gate thyristor according to the ninth embodiment of the present invention. Similarly to the seventh embodiment, the thyristor of the present embodiment is produced using a bulk wafer, rather than an epitaxial wafer, and the p emitter layer 1 is directly formed on the fear surface of the n base layer 3. A hexagonal pattern similar to that of FIG. 6 is employed as a planar pattern of this embodiment. As in the third embodiment of FIG. 5, a portion of Me gate oxide film 9 located above the second p base region 6 has the same thickness (of 0.07 $\mu$m) as that of the gate oxide film 9 of the first embodiment, and a portion of the gate electrode 9a located above the first p base region 4 and n base layer 3 has a reduced thickness (of 0.05 $\mu$m).

The trade-off characteristic between the ON-state voltage and the turn-off time measured with respect to the insulated gate thyristor of the ninth embodiment is substantially the same as that of the seventh embodiment, and is better than those of ESTs and IGBT.

As explained above with respect to the third embodiment, the resistance of the inversion layer appearing in the first channel region 20 and the resistance of the accumulation layer appearing in the surface layer of the n base layer 3 are reduced, and therefore an increased amount of electrons are supplied from the n source region 7, with a result of an increase in the amount of electron injected from the n source region 7 and n emitter region 8, whereby the ON-state voltage is reduced.

Tenth Embodiment

Figure 17:
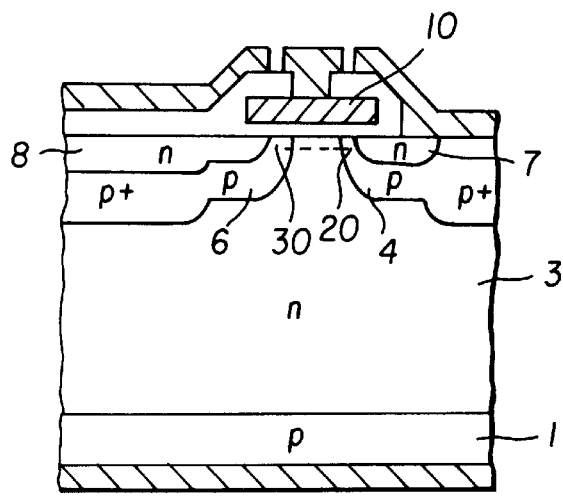
FIG. 17 is a cross-sectional view of a part of an insulated gate thyristor according to the tenth embodiment of the present invention.

FIG. 17 is a cross-sectional view showing a part of an insulated gate thyristor according to the tenth embodiment of the present invention. Similarly to the seventh embodiment, the thyristor of the present embodiment is produced using a bulk wafer, rather than an epitaxial wafer, and the p emitter layer 1 is directly formed on the rear surface of the n base layer 3. As in the fourth embodiment of FIG. 7, the width of the first channel region 20 as the surface layer of the first p base region 4 interposed between the n source region 7 and the n base layer 3 is controlled to be smaller than that of the second channel region 30 as the surface layer of the second p base region 6 interposed between the n emitter region 8 and the n base layer 3, and the second p base region 6 is formed over a larger area of the silicon substrate than the first p base region. FIG. 8(a) is also a cross-sectional view of the insulated gate thyristor of this embodiment, showing its horizontal plane passing the middle of the gate electrode layer 10, and FIG. 8(b) is also a plan view showing respective diffusion regions formed in the surface of the silicon substrate of this thyristor from which insulating films and electrodes are removed.

The graph of FIG. 14 also shows a trade-off characteristic between the ON-state voltage and turn-off time of the insulated gate thyristor of the tenth embodiment. The trade-off characteristic of the device of the tenth embodiment is better than not only those of ESTs and IGBT as comparative examples, but also that of the insulated gate thyristor of the sixth embodiment.

By increasing the areas of the second p base region 6 and n emitter region 8, an increased amount of holes injected from the p emitter layer 1 into the n base layer 3 are led to the thyristor portion, thus making it fag to switch the device to the thyristor mode, as explained above with respect to the fourth embodiment.

Eleventh Embodiment

An insulated gate thyristor according to the eleventh embodiment of the present invention is produced using a bulk wafer, rather than an epitaxial wafer, as in the seventh embodiment, and the p emitter layer 1 is directly formed on the rear surface of the n base layer 3. As in the fifth embodiment of FIG. 10, first p base regions 4, n source regions 7 inside the first p base regions 4, second p base regions 6, and n emitter regions 8 inside the second p base regions are all formed in the shape of parallel stripes. The cathode electrode 11 is in contact with areas bounded by dotted lines, which extend over the n source regions 7 and $p^+$ well regions 5. The width of the second p base region 6 is larger than that of the first p base region 4, as in the fifth embodiment. The cross-sectional view of this embodiment is almost identical with that of FIG. 17.

The trade-off characteristics between the ON-state voltage and the turn-off time with respect to the insulated gate thyristor of the eleventh embodiment is substantially the same as that of the tenth embodiment, and better than those of ESTs, IGBT and the insulated gate thyristors of the seventh, eighth and ninth embodiments. By increasing The areas of the second base region 6 and n emitter region 8, an increased amount of holes injected from the p emitter region 1 into the n base layer 3 are led to the thyristor portion, whereby the device can be quickly switched to the thyristor mode, as explained above with respect to the tenth embodiment.

Twelfth Embodiment

An insulated gate thyristor according to the twelfth embodiment of the present invention is produced using a bulk wafer, rather than an epitaxial wafer, in a similar manner to the seventh embodiment and the P emitter layer is directly formed on the rear surface of the n base layer. The plan view of the present embodiment showing respective diffusion regions formed in the surface of the silicon substrate from which insulating films and electrodes are removed is similar to that of FIG. 11 showing the sixth embodiment. In the present embodiment, first p base regions, n source regions inside the first p base regions, second p base regions, and n emitter regions inside the second p base regions are all formed in the shape of parallel stripes. While the first p base regions 4 and second p base regions 6 are alternately formed in the eleventh embodiment, two first p base regions are successively arranged between two second p base regions in the twelfth embodiment, namely, the thyristor of this embodiment includes a portion in which second p base region, first p base region, first p base region, and first p base region are arranged in this order. The first p base regions and second p base regions are separated by exposed surface portions of the n base layer. The cathode electrode 11 is in contact with areas bounded by dotted lines, which extend over the n source regions 7 and p$^+$ well regions 5.

Figure 18A:
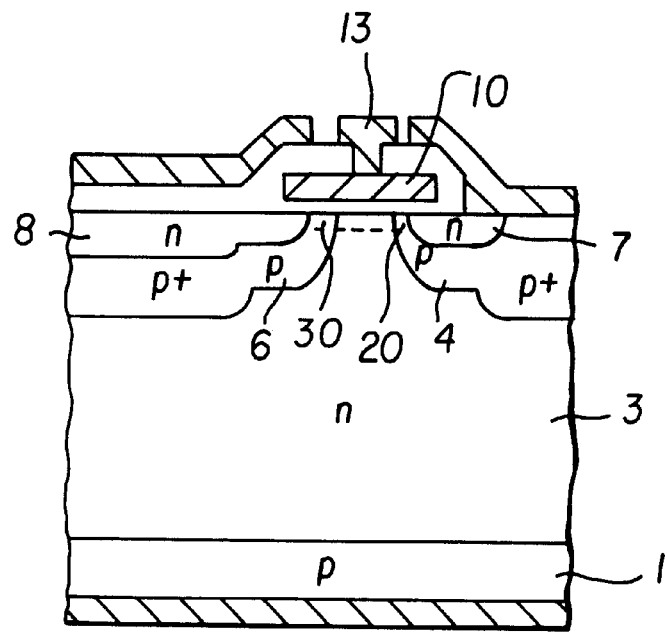
FIGS. 18(a) and 18(b) are cross-sectional views showing parts of an insulated gate thyristor according to the eleventh embodiment of the present invention.
Figure 18B:
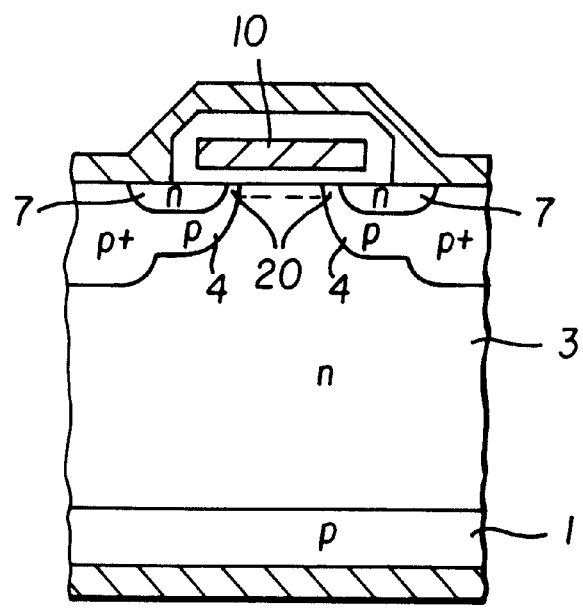

FIG. 18(a) is a cross-sectional view of the insulated gate thyristor of the twelfth embodiment, taken along a line connecting the n emitter region 8 and the n source region 7, and FIG. 18(b) is a cross-sectional view of the same insulated gate thyristor, taken along a line connecting two n source regions 7. As shown in FIG. 18(a), the width of the first channel region 20 is smaller than that of the second channel region 30, and the second p base region 6 is formed over a larger area than the first p base region 4. In the cross section of FIG. 18(b), two first channel regions 20 formed in the respective first p base regions 4 face each other. In the case of the striped pattern, the gate electrode layer 10 can be easily formed with the same width.

By increasing the areas of the IGBT portion, an increased amount of electrons; are supplied from the n source region 7 in the initial period after turn-on, and therefore an increased amount of holes are injected from the p emitter layer 1, whereby the device can be more quickly switched to the thyristor mode.

Thirteenth Embodiment

Figure 19A:
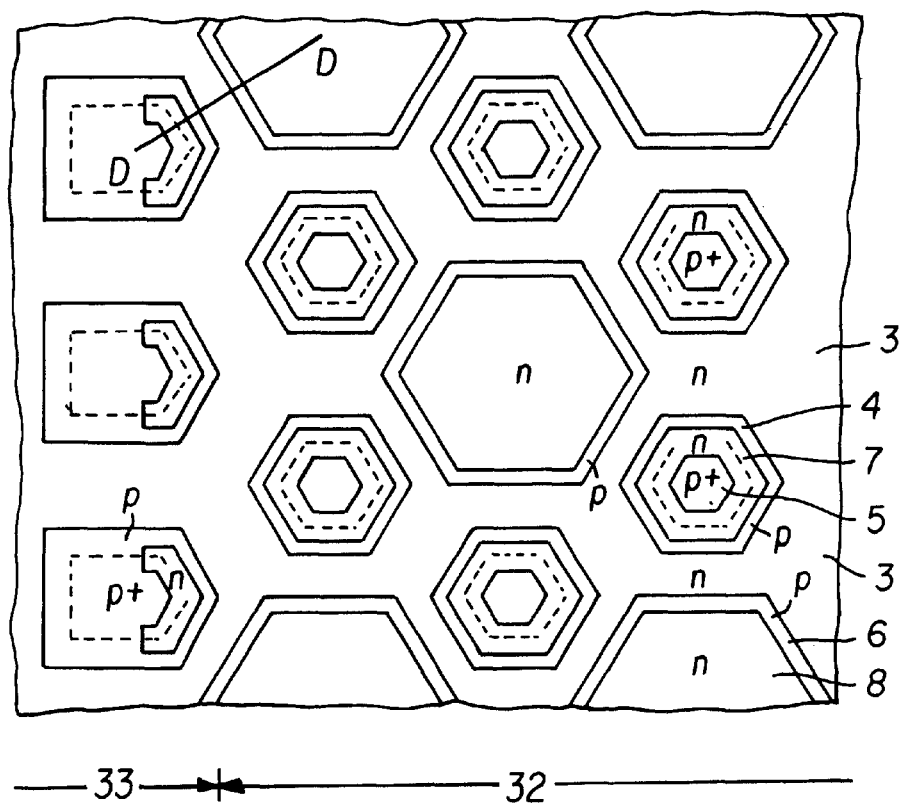
FIG. 19(a) is a plan view showing the surface of a silicon substrate of an insulated gate thyristor according to the thirteenth embodiment of the present invention.
Figure 19B:
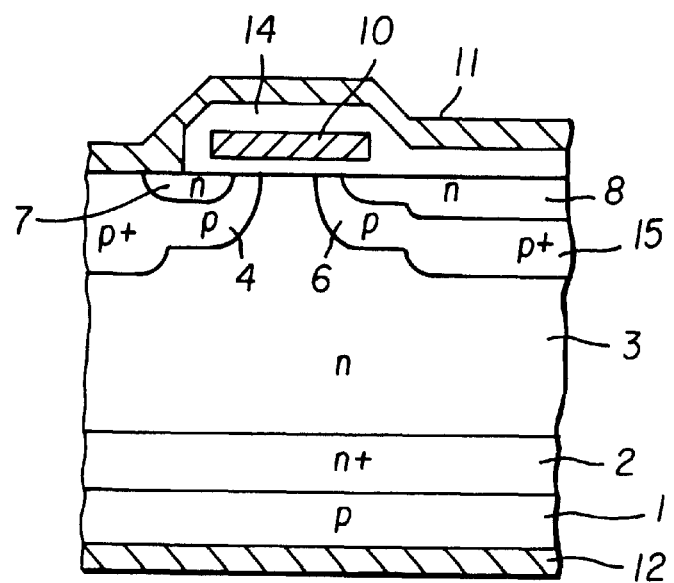
FIG. 19(b) is a cross-sectional view taken along line D—D in FIG. 19(a)

FIG. 19(a) is a plan view showing diffusion regions formed in the surface of a silicon substrate of an insulated gate thyristor according to the thirteenth embodiment of the present invention, from which surface insulating films and electrodes are removed. FIG. 19(b) is a cross-sectional view taken along line D—D in FIG. 19(a).

The insulated gate thyristor of this embodiment except the left end portion in FIG. 19(a) provides an active region 32 for switching current, which has hexagonal patterns similar to those of FIG. 9. In each hexagonal pattern formed in the surface layer of the n base layer 3, hexagonal first p base regions 4 in which hollow, hexagonal n source regions 7 are formed are disposed around a hexagonal second p base region 6 in which an n emitter region 8 is formed The left end portion of FIG. 19(a) shows a peripheral region 33 for the active region 32, wherein an array of hexagonal first p base regions 4 having respective n source regions 7 formed inside thereof is provided so as to surround the second p base regions 6. The cathode electrode 11 is in contact with areas bounded by dotted lines in FIG. 19(a).

The cross-sectional view of FIG. 19(b) shows the cathode electrode 11, gate electrode layer 10, gate oxide film 9, insulating film 14, and insulating film 19 oil the n emitter layer 8, which are formed on the silicon substrate, in addition to the diffusion regions as described above. In the peripheral region 33 as shown in FIG. 19(b), a p$^+$ well region 5 having a larger diffusion depth than the first p base region 4 is formed as part of the first p base region 4, and the cathode electrode 11 is in contact with the surface of the p$^+$ well region 5. Thus, the peripheral region 33 has the same structure as the IGBT portion of the active region 32.

By arranging the IGBT portions each consisting of the first p base region 4 and the n source region 7 formed in its inside in the peripheral region 33 for the active region 32 of the insulated gate thyristor, it is possible to remove or discharge holes remaining in the n base layer 3 at the time of turn-off; and thus avoid current concentration.

Figure 20:
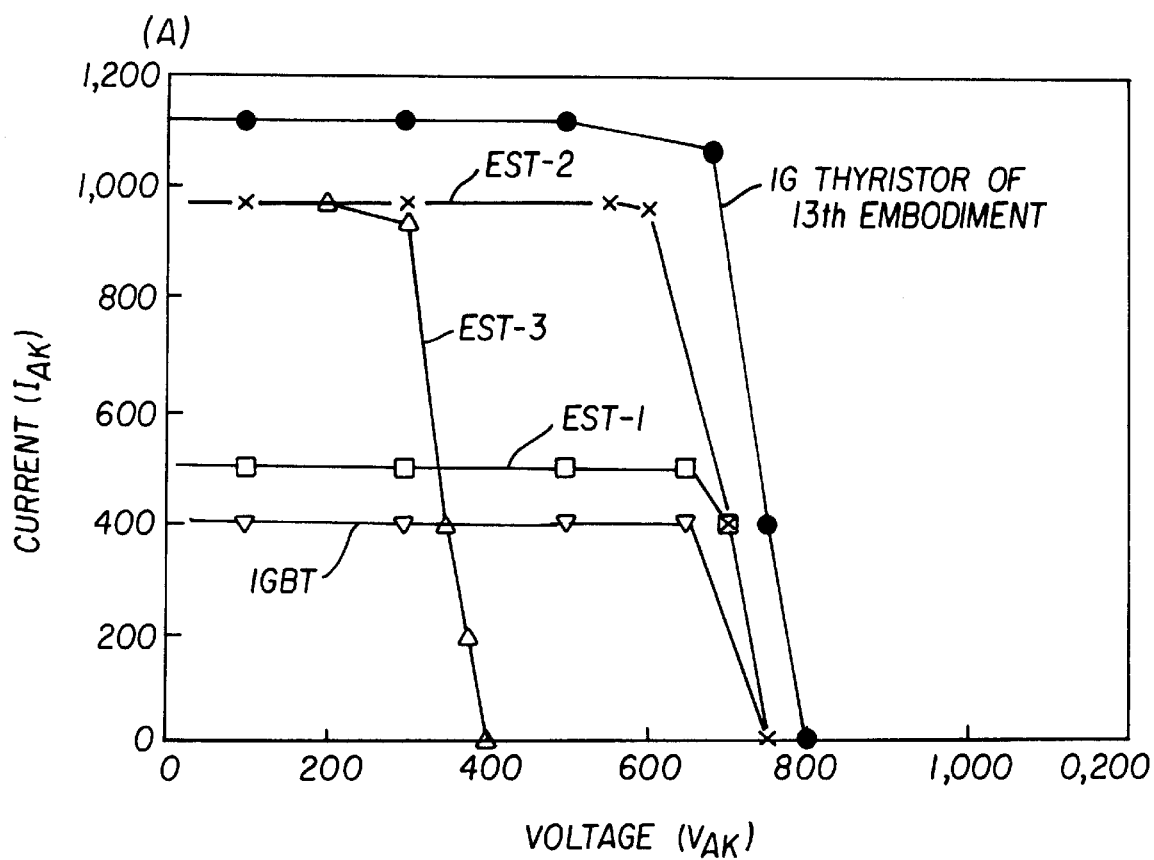
FIG. 20 is a graph showing RBSOA of 600 V-class devices of the thirteenth embodiment and comparative examples.
Figure 21:
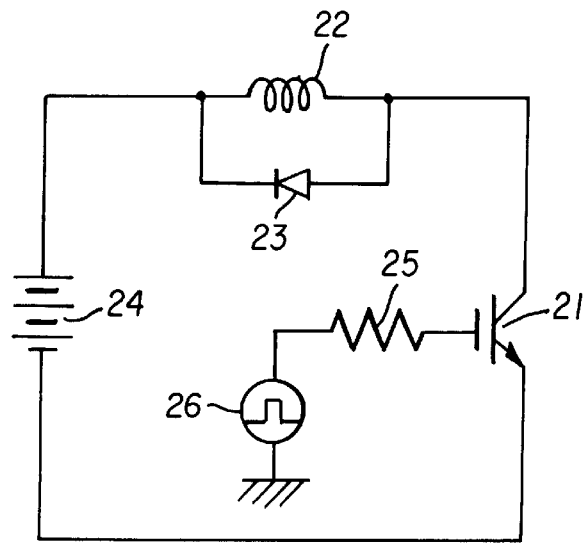
FIG. 21 is a circuit diagram for measuring the RBSOA.

The insulated gate thyristor of the thirteenth embodiment as shown in FIG. 19 (a), (b) may be produced as a 600V-class device using an epitaxial wafer as in the first embodiment. The graph of FIG. 20 shows results of measurements of reverse bias safe operation areas (RBSOA) of the insulated gate thyristor of the thirteenth embodiment and 600V-class EST-1, EST-2, EST-3 and IGBT described above as comparative examples. The RBSOA was measured at 125° C. with a measuring circuit as shown in FIG. 21. In FIG. 20, the horizontal axis indicates voltage ($V_{AK}$ between the anode and the cathode, and the vertical axis indicated electric circuit ($I_{AK}$).

In the measuring circuit of FIG. 21, a device 21 to be measured is connected to a dc power supply 24, through a 1 mH inductor 22 and a free-wheeling diode 23 connected in parallel with the inductor 22, and a gate of the device 21 is connected to a gate power supply 26, through a 20Ω-resistor 25.

The devices whose measurement results are shown in FIG. 20 were produced as 600V-class devices, and the devices of the comparative examples were produced using epitaxial wafers having the same specification as that of the insulated gate thyristor of the first embodiment. When the lifetime of carriers was controlled in the same manner as in the first embodiment, the ON-state voltage, as defined by a fall of the potential measured during conduction of current 100 A/cm$^2$, was 0.9V for the insulated gate thyristor of the thirteenth embodiment, 1.6V for EST-1, 1.7V for EST-2, 1.0V for EST-3, and 2.3V for IGBT. Thus, the device of the thirteenth embodiment of the present invention has a lower ON-state voltage than other devices. It will be understood from FIG. 20 that the device of the thirteenth embodiment of the present invention has a reverse bias safe operation area that is three times as large as that of IGBT, and twice as large as those of EST-1 and EST-3, and thus assures a sufficiently high breakdown voltage. The breakdown voltage of the device of the present embodiment is even higher than that of EST-2.

The improvement in the breakdown voltage is a consequence of the provision of the array of the IGBT portions in the peripheral portion 33 adjacent the active region 32, which is able to rapidly discharge minority carriers in the n base layer 3, and avoid current concentration.

Figure 22:
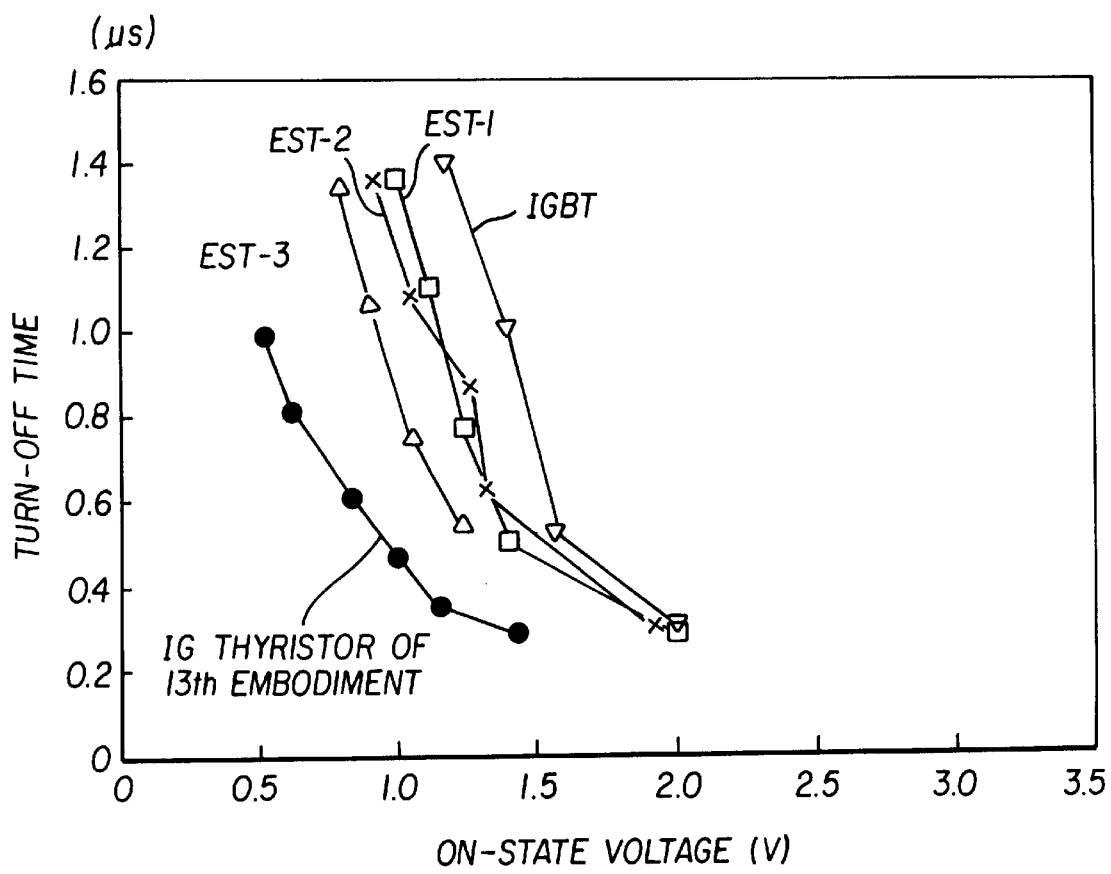
FIG. 22 is a graph showing the trade-off characteristic between the ON-state voltage and the turn-off time of 600 V-class devices of the thirteenth embodiment and comparative examples.

FIG. 22 is a graph showing a trade-off characteristic between the ON-state voltage and the turn-off time of each of the devices as described above. The horizontal axis indicates the ON-state voltage, and the vertical axis indicates the turn-off time. The ON-state voltage is defined by a fall of the potential measured at 25° C. during conduction of current of 100 A.cm$^{-2}$. It will be understood from FIG. 22 that the device of the thirteenth embodiment shows a better trade-off characteristic than ESTs and IGBT.

Fourteenth Embodiment

Figure 23A:
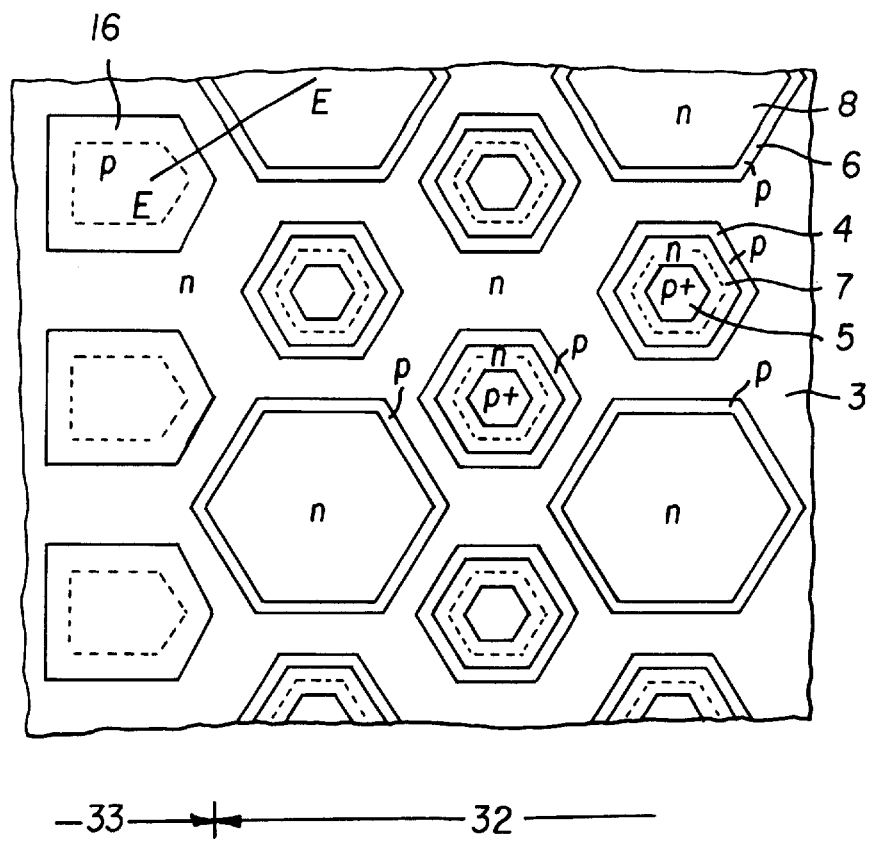
FIG. 23(a) is a plan view showing the surface of a silicon substrate of an insulated gate thyristor according to the fourteenth embodiment of the present invention.
Figure 23B:
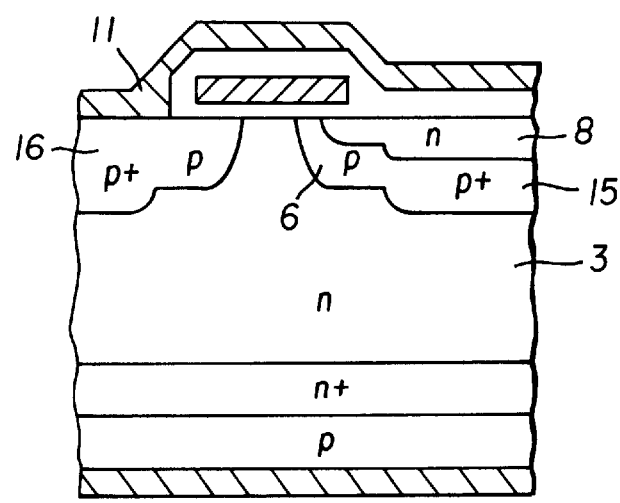
FIG. 23(b) is a cross-sectional view taken along line E—E in FIG. 23(a)

FIG. 23(a) is a plan view showing respective diffusion regions formed in the surface of a silicon substrate of an insulated gate thyristor according to the fourteenth embodiment of the present invention, from which insulating films and electrodes are removed. This figure shows an active region of the thyristor, and a peripheral region adjacent to the active region. FIG. 23(b) is a cross-sectional view taken along line E—E in FIG. 23(a).

In this embodiment, too, the active region 32 shown in FIG. 23(a) has hexagonal patterns, but the arrangement of the diffusion regions is slightly different from that of the thirteenth embodiment. Namely, four second p base region 6 are positioned so as to from a rectangular pattern in the surface layer of the n base layer 3, and four first p base regions 4 are positioned between the second p base regions 6 so as to form a rhombic pattern. The second p base region 6 is formed over a larger area than the first p base region 4. The above arrangement of the diffusion regions may be established based on hexagonal patterns. The left end portion of FIG. 23(a) shows a peripheral region 33 for the active region 32 of the insulated gate thyristor, wherein an array of pentagonal diverters 16 is formed so as to surround the second p base regions 6. The cathode electrode 11 is in contact with areas bounded by dotted lines in FIG. 23.

The cross-sectional view of FIG. 23(b) shows the cathode electrode 11, gate electrode layer 10, gate oxide film 9, insulating film 14, and insulating film 19 on the n emitter layer 8, which are formed on the silicon substrate, in addition to the diffusion regions as described above. In the peripheral region 33 as shown in FIG. 23(b), the diverter 16 may be formed at the same time that the p base region 4 and p well region 5 having a large diffusion depth are formed, and the cathode electrode 11 is in contact with the surface of the diverter 16.

Providing the diverter 16 in the peripheral region 33 adjacent the active region 32 of the insulated gate thyristor, it is possible to remove or discharge holes remaining in the n base layer 3 at the time of turn-off, and thus avoid current concentration.

A 600V-class insulated thyristor was produced according to the fourteenth embodiment, and its RBSOA was measured at 125° C. using the measuring circuit shown in FIG. 21. The result of this measurement (RBSOA) was substantially equal to that of the insulated gate thyristor of the thirteenth embodiment. Also, the trade-off characteristic between the ON-state voltage and the turn-off time measured with respect to the device of the fourteenth embodiment is substantially the same as that of the insulated gate thyristor of the thirteenth embodiment, and is better than those of EST's and IGBT.

Fifteenth Embodiment

Figure 24A:
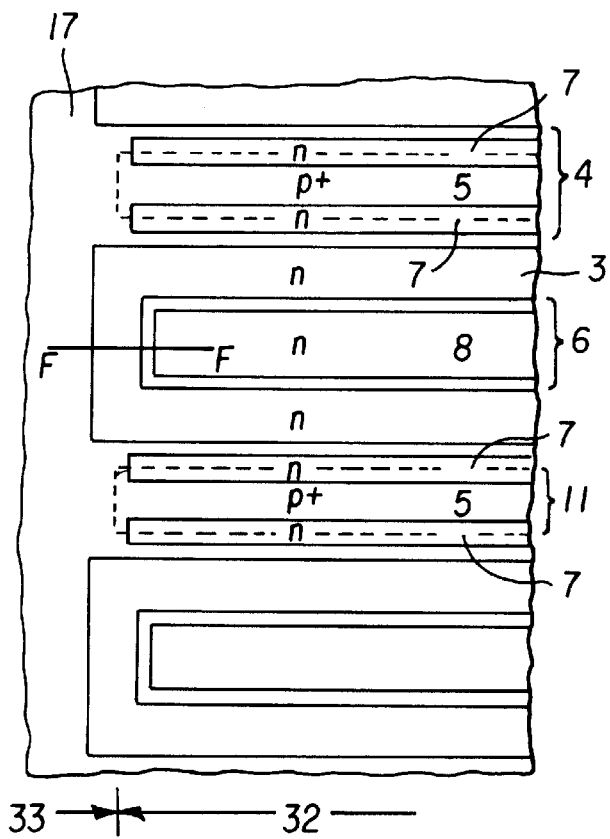
FIG. 24(a) is a plan view showing the surface of a silicon substrate of an insulated gate thyristor according to the fifteenth embodiment of the present invention.
Figure 24B:
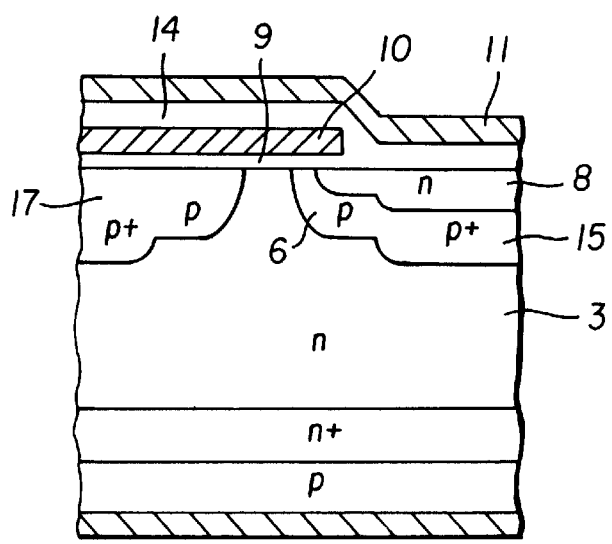
FIG. 24(b) is a cross-sectional view taken along line F—F in FIG. 24(a)

FIG. 24(a) is a plan view showing respective diffusion regions formed in the surface of a silicon substrate of an insulated gate thyristor according to the fifteenth embodiment of the present invention, from which insulating films and electrodes are removed. This figure shows an active region 32 of the thyristor, and a peripheral region 33 adjacent the active region 32. FIG. 24(b) is a cross-sectional view taken along line F—F in FIG. 24(a).

The insulated gate thyristor of FIG. 24(a) except its left end portion provides an active region 32 for switching current, which has striped patterns similar to those of the fifth embodiment. In each striped pattern of this embodiment, the first p base region 4 formed in the surface layer of the n base layer 3 has a larger area than the second p base region 6. The left end portion of FIG. 24(a) shows a peripheral region 33 for the active region 32 of the insulated gate thyristor, in which a p bypass region 17 that connects the stripe-shaped first p base regions 4 of the active region 32 is formed to surround the second p base regions 6. The cathode layer 11 is in contact with areas bounded by dotted lines in FIG. 24(a).

The cross-sectional view of FIG. 24(b) shows the cathode electrode 11, gate electrode layer 10, gate oxide film 9, insulating film 14, and insulating film 19 on the n emitter layer 8, which are formed on the silicon substrate, in addition to the diffusion regions as described above. As shown in FIG. 24(b), the p bypass region 17 may have the same structure as the first p base region 4 and the p well region 5 having a large diffusion depth, and may be formed at the same time that these regions 4, 5 are formed. The gate electrode layer 10 is formed over the p bypass region 17 with the gate oxide film 9 interposed therebetween, and the cathode electrode 11 is not in contact with the p bypass region 17, unlike the fourteenth embodiment 14 of FIG. 23(b). As is understood from FIG. 24(b), however, the p bypass region 17 provided in the peripheral region 33 is connected to the stripe-shaped first p base regions 4 of the active region 32, and the cathode electrode 11 is in contact with the first p base regions 4, so that a sufficient amount of minority carriers can be discharged into this p bypass region 17.

By providing the p bypass region 17 in the peripheral region 33 for the active region 32 of the insulated gate thyristor, it is possible to discharge holes remaining in the n base layer 3 at the time of turn-off, and thus avoid current concentration.

A 600V-class insulated gate thyristor was produced according to the fifteenth embodiment, and its RBSOA was measured at 125° C. using the measuring circuit shown in FIG. 21. The result of this measurement (RBSOA) was substantially equal to that of the insulated gate thyristor of the thirteenth embodiment shown in FIG. 22. Also, the trade-off characteristic between the ON-state voltage and the turn-off time measured with respect to the device of the fifteenth embodiment was substantially the same as that of the insulated gate thyristor of the thirteenth embodiment.

Sixteenth Embodiment

An insulated gate thyristor as the sixteenth embodiment of the present invention is produced with a similar structure to the insulated gate thyristor of the thirteenth embodiment, using a bulk silicon wafer. Namely, an array of IGBT portions each consisting of the first p base region and n source region is provided in the peripheral region for the active region of the insulated gate thyristor, and the p emitter layer is directly formed on the rear surface of the n base layer.

Figure 25:
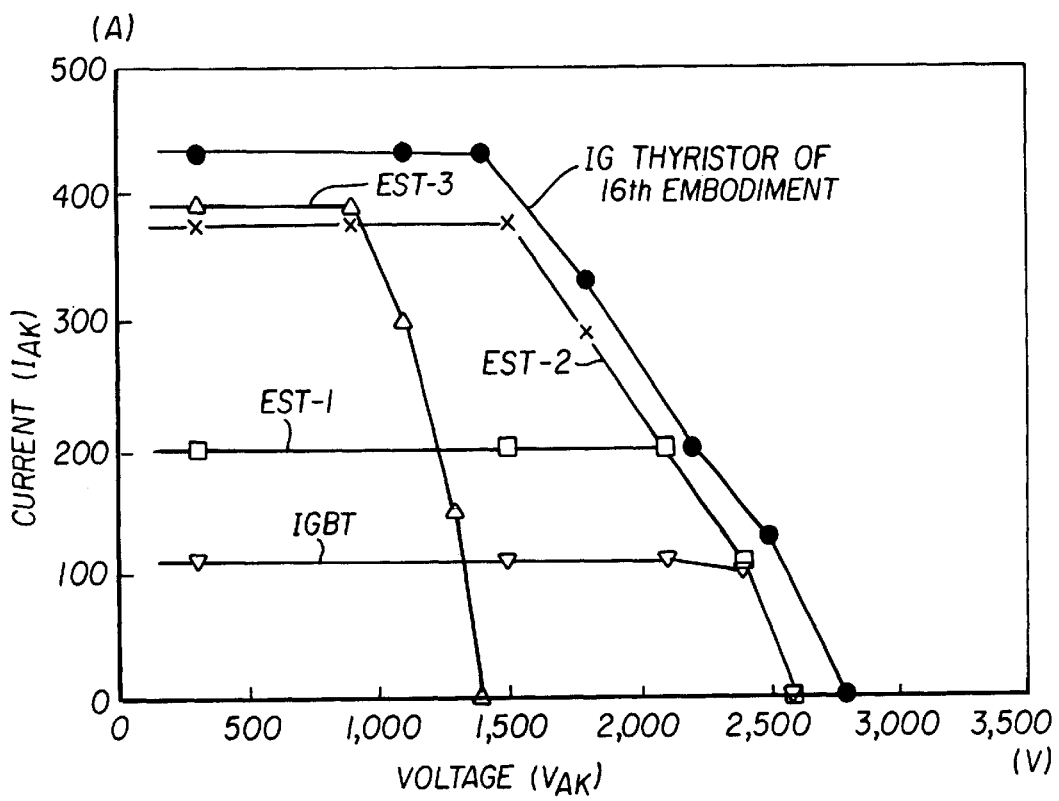
FIG. 25 is a graph showing RBSOA of 600 V-class devices of the sixteenth embodiment and comparative examples.

The graph of FIG. 25 shows results of measurements of reverse bias safe operation areas (RBSOA of 2500V-class insulated gate thyristor of the sixteenth embodiment, and EST-1, EST-2, EST-3 and IGBT described above as comparative examples. The measurements were conducted at 125° C., using the measuring circuit as shown in FIG. 21. In FIG. 25, the horizontal axis indicates voltage ($V_{AK}$) between the anode and the cathode, and the vertical axis indicates electric circuit ($I_{AK}$).

The devices of the present embodiment and comparative examples, whose measurement results are shown in FIG. 25, were produced using bulk wafers having the same specification as the insulated gate thyristor of the seventh embodiment as described above. The emitter regions 8 of the EST-2 and EST-3 had a width of 20 $\mu$m. All of the above five types of devices had a chip size of 1 cm$^2$. When the lifetime of carriers was controlled in the same manner, the ON-stage voltage, as defined by a fall of the potential measured during conduction of 50 A.cm$^{-2}$, was 1.1V for the insulated gate thyristor of the sixteenth embodiment, 2.0V for EST-1, 2.2V for EST-2, 1.4V for EST-3, and 3.3V for IGBT. Thus the ON-stage voltage of the device of the sixteenth embodiment of the present invention is lower than those of the comparative devices. It will be understood from FIG. 25 that the device of the sixteenth embodiment of the present invention has a reverse bias safe operation area that is four times as large as that of IGBT, and twice as large as that of EST-1, and thus assures a sufficiently high breakdown voltage. The breakdown voltage of the device of the present embodiment is even higher than that of EST-2.

The increase in the breakdown voltage is a consequence of the provision of the array of the IGBT portions that are arranged in the peripheral portion 33 so as to surround the thyristor portions in the active region 32, which array is able to quickly discharge minority carriers in the n base layer 3, and thus avoid current concentration.

Figure 26:
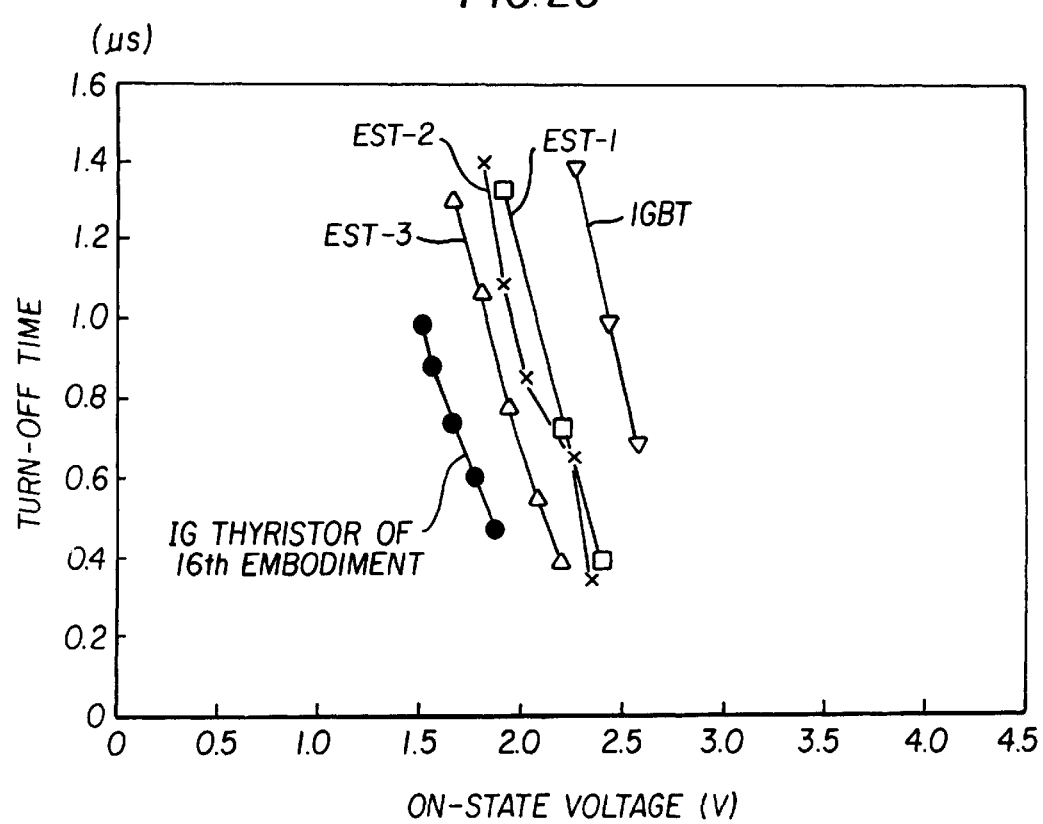
FIG. 26 is a graph showing the trade-off characteristic between the ON-state voltage and the turn-off time of 2500 V-class devices of the sixteenth embodiment and comparative examples.

FIG. 26 is a graph showing a trade-off characteristic between the ON-stage voltage and the turn-off time of each of the 2500V-devices as described above. The horizontal axis indicates the ON-state voltage, and the vertical axis indicates the turn-off time. The ON-stage voltage is defined by a fall of the potential measured at 25° C. during conduction of current of 50 A.cm$^{-2}$. It will be understood from FIG. 26 that the device of the sixteenth embodiment shows a better trade-off characteristic than ESTs and IGBT.

Seventeenth Embodiment

An insulated gate thyristor according to the seventeenth embodiment of the present invention is produced with a similar structure to the insulated gate thyristor of the fourteenth embodiment, using a bulk silicon wafer. Namely, an array of diverters is provided in the peripheral region for the active region of the insulated gate thyristor, and the p emitter layer is directly formed on the rear surface of the n base layer.

Eighteenth Embodiment

An insulated gate thyristor according to the eighteenth embodiment of the present invention is produced with a similar structure to the insulated gate thyristor of the fifteenth embodiment, using a bulk silicon wafer. Namely, a p bypass region that connects stripe-shaped first p base regions of the active region is formed in the peripheral region of the insulated gate thyristor, and the p emitter layer is directly formed on the rear surface of the n base layer.

2500V-class insulated gate thyristors according to the seventeenth and eighteenth embodiments were produced, and their reverse bias operation areas (RBSOA) were measured at 125° C., using the measuring circuit shown in FIG. 21. The results of the measurements on these thyristors were equivalent to that on the insulated gate thyristor of the sixteenth embodiment. The trade-off characteristics between the ON-stage voltage and the turn-off time measured with respect to the devices of the seventeenth and eighteenth embodiments were equivalent to that of the insulated gate thyristor of the sixteenth embodiment.

Nineteenth Embodiment

Figure 27:
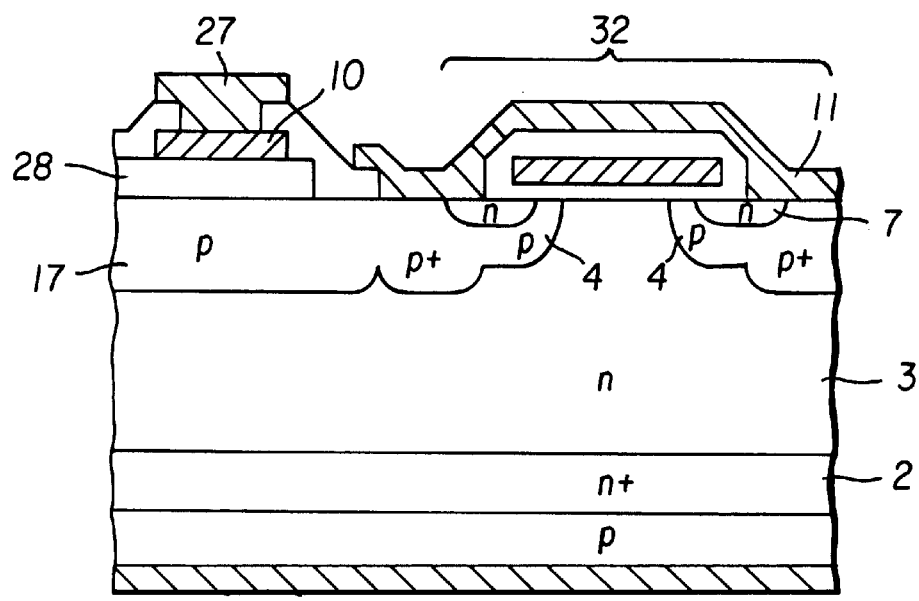
FIG. 27 is a cross-sectional view of a part of an insulated gate thyristor according to the nineteenth embodiment of the present invention.

FIG. 27 is a cross-sectional view showing an insulated gate thyristor of the nineteenth embodiment of the present invention, along with a gate pad and its surroundings.

In this embodiment, the active region 32 shown in the right-hand side portion of FIG. 27 may be formed in a hexagonal or other cell pattern or a striped pattern. The left-hand side portion of FIG. 27 shows a gate pad 27 of the insulated gate thyristor, which is formed on the gate electrode layer 10 that is in turn formed on a thick oxide film 28. This gate pad 27, which is formed over a large area of the silicon substrate, is not located in the active region, and hence no cell is produced below the gate pad 27. In this portion of the substrate below the gate pad 27, a p bypass region 17 to be connected to the cathode electrode 11 is formed by implantation of boron ions. In this embodiment, the gate pad 27 is connected to the first p base regions 4 that are in contact with the cathode electrode 11.

The oxide film 28 normally having a large thickness is formed right under the gate pad 27, so that shocks during wire bonding, for example, are absorbed by the thick oxide film 28. Therefore, carriers that are moved into the portion of the silicon substrate right under the thick oxide film 28 flow into the first p base regions 4 located adjacent to the thick oxide film during turn-off. Thus, current tends to be concentrated at the portions of the first p base regions adjacent to the oxide film 28. In the present embodiment, therefore, the p bypass region 17 is provided in the surface layer of the silicon substrate right under the thick oxide film 28, and this region 17 is connected to the cathode electrode 11, so that the carriers that are moved into the substrate portion right below the oxide film 28 are discharged from the p bypass region 17 to the cathode electrode 11, thereby significantly reducing the possibility of current concentration at the adjacent first p base regions 4. Consequently, the present insulated gate thyristor provides a significantly increased breakdown voltage.

A sample of the insulated gate thyristor of the nineteenth embodiment was produced, and its reverse bias operation area (RBSOA) was measured at 125° C., using the measuring circuit shown in FIG. 21. The result of the measurement was equivalent to that on the insulated gate thyristor of the thirteenth embodiment. The trade-off characteristics between the On-state voltage and the turn-off time measured with respect to the device of the present embodiment was also equivalent to that of the insulated gate thyristor of the thirteenth embodiment. The p bypass region may also be formed right below a gate runner that serves as a wire to be connected to the gate electrode, as well as the gate pad 27.

While the insulated gate thyristor of FIG. 27 includes an epitaxial wafer having an n buffer layer 2, the above-described structure may be applied to an insulated gate thyristor using a bulk wafer.

Twentieth Embodiment

Figure 28:
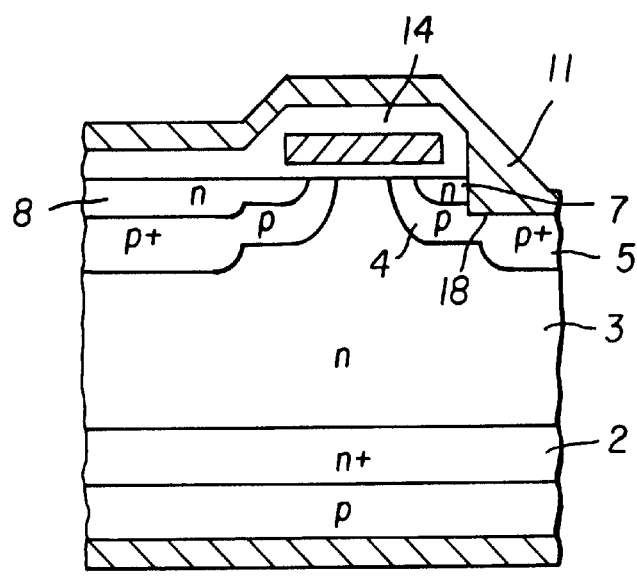
FIG. 28 is a cross-sectional view of a part of an insulated gate thyristor according to the twentieth embodiment of the present invention.

Another structure for quickly discharging minority carriers during turn-off has been developed. FIG. 28 is a cross-sectional view showing a part of an insulated gate thyristor according to the twentieth embodiment of the present invention. In this embodiment, a trench 18 is formed in the silicon substrate so as to extend from the surface of the n source region 7 formed in the first p base region 4, to a depth larger than that of the n source region 7. For example, the diffusion depth of the n source region 7 is 0.3 $\mu$m, and the depth of the trench 18 is 0.5 $\mu$m. The cathode electrode 11 is in contact with the side face of the n source region 7 and the p$^+$well region 5 which is exposed to the bottom of the trench 18. The planar pattern of this embodiment is similar to the hexagonal cell pattern as shown in FIG. 9.

About 15 $\mu$m-thickness n layer having a resistivity of 0.05 Ω.cm and providing the nu$^+$buffer layer 2, and an about 115 $\mu$m-thickness n layer having a resistivity of 80 Ω.cm and providing the n base layer 3 were epitaxially grown on a 450 μm-thickness p type silicon substrate having a resistivity of 0.02 Ω.cm, so as to provide an epitaxial wafer. Using this epitaxial wafer, four specimens of 1200V-class devices having almost the same dimensions as the insulated gate thyristor of the fourth embodiment and a pattern similar to that of FIG. 9 were produced such that the n source regions 7 of the respective devices were 1.0 μm, 1.5 μm, 3.5 μm and 5 μm.

Figure 29:
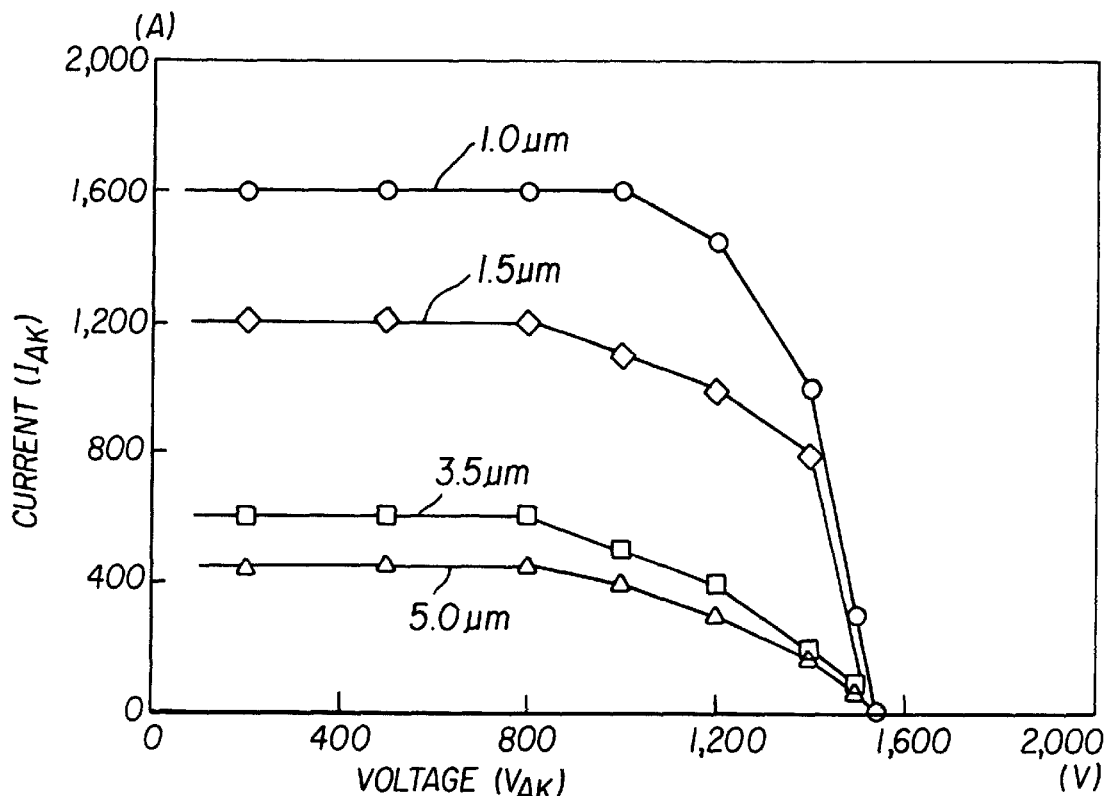
FIG. 29 is a graph showing RBSOA of experimental devices having different widths of n source regions.

The graph of FIG. 29 shows reverse bias safe operation areas (RBSOA) measured at 125° with respect to these four devices, using the measuring circuit shown in FIG. 21. In FIG. 29, the horizontal axis indicates voltage ($V_{AK}$) between the anode and the cathode, and the vertical axis indicates electric circuit ($I_{AK}$).

As is understood from FIG. 29, the current density depends upon the voltage in a portion of the RBSOA where the device breaks down with avalanche current applied thereto, while the current density does not depends upon the voltage in another portion of the RBSOA where the device breaks down due to latchup of a parasitic thyristor. As the width of the n source region 7 is reduced, the portion of the RBSOA in which the current density does not depend upon the voltage is increased. Namely, a potential difference due to carriers flowing in a horizontal direction below the n source region 7 is reduced with a decrease in the width of the n source region 7, thereby reducing a possibility of latch-up of a parasitic thyristor.

Figure 30:
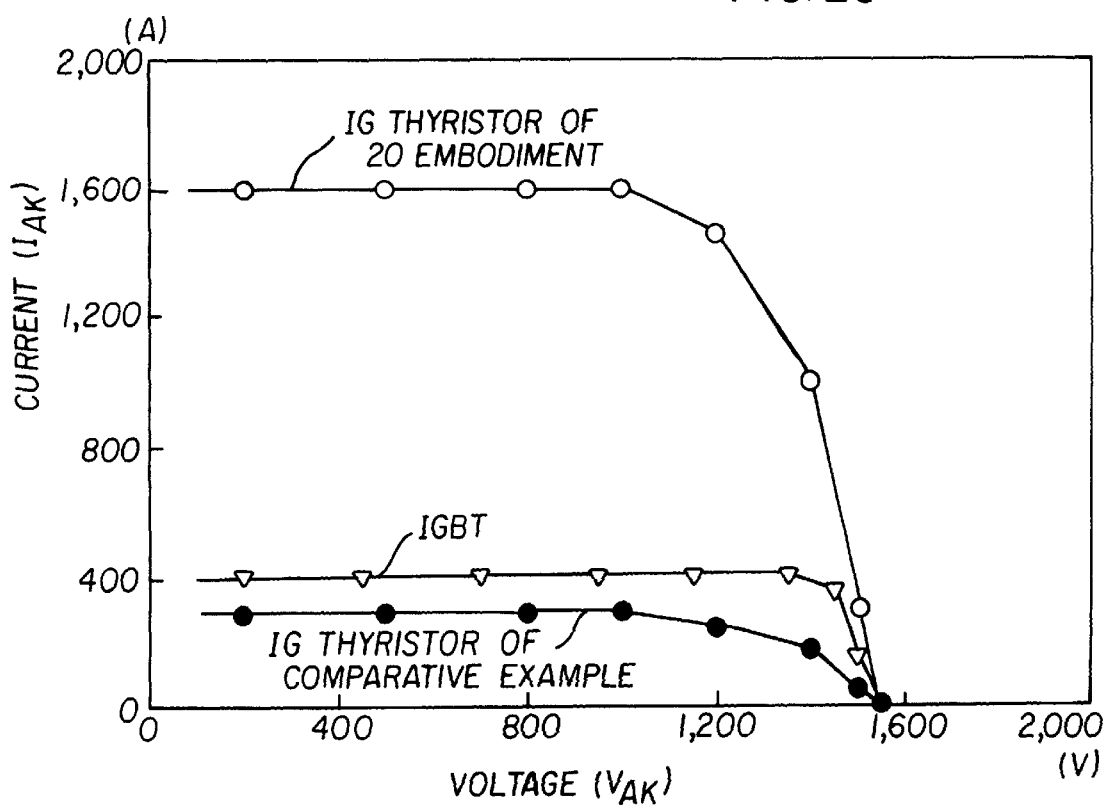
FIG. 30 is a graph showing RBSOA of 1200 V-class devices of the twentieth embodiment and comparative examples.

The graph of FIG. 30 shows results of measurements of RBSOA of 1200V-class devices, i.e., insulated gate thyristor of the twentieth embodiment with 1.0 μm-width n source regions 7, a comparative example in the form of an insulated gate thyristor having 3.5 μm-width n source regions 7 and having no trench 18, and IGBT. The width of each n source region of the IGBT was 3.5 μm.

Comparing the insulated gate thyristor of the twentieth embodiment with the comparative example, it will be understood that the RBSOA of the present embodiment is especially large in the portion where the current density does not depend upon the voltage. This is because a parasitic thyristor is less likely to latch up in the insulated gate thyristor of the twentieth embodiment in which the width of the n source region 7 is reduced.

Comparing the insulated gate thyristor of the comparative example IGBT, it is found that the IGBT has a greater breakdown voltage during turn-off, even though the width of the n source region is the same in the comparative example and the IGBT. This is because in IGBT the first p base region and n source region are formed in a portion of the substrate in which the second p base region is formed, and thus the number of contact areas with the cathode electrode 11 is increased, whereby the turn-off current per unit cell is reduced when the same current density is turned off.

While the trench 18 is formed and the cathode electrode 11 is in contact with the side face of the n source region 7 exposed to the trench 18 in the twentieth embodiment, the electrode 11 does not necessarily contact with the side face of the region 7 since the width of the n source region 7 is an important variable in this embodiment.

If the trench 18 is formed using a photomask for forming a pattern of the insulating film 14 on the gate electrode layer 10, there is no need to newly produce a mask for forming the trench, or a mask that is patterned to change the width of the n source region 7.

Twenty-first Embodiment

At about 10 μm-thickness n layer having a resistivity of 0.1 Ω.cm and providing the n⁺ buffer layer 2, and an about 60 μm-thickness n layer having a resistivity of 40 Ω.cm and providing the n base layer 3 were successively formed by epitaxial growth on a 450 μm-thickness p type silicon substrate having a resistivity of 0.02 Ω.cm, so as to provide an epitaxial wafer. Using this epitaxial wafer, a 600V-class device similar to that of the twentieth embodiment was produced as the twenty-first embodiment of the present invention.

Figure 31:
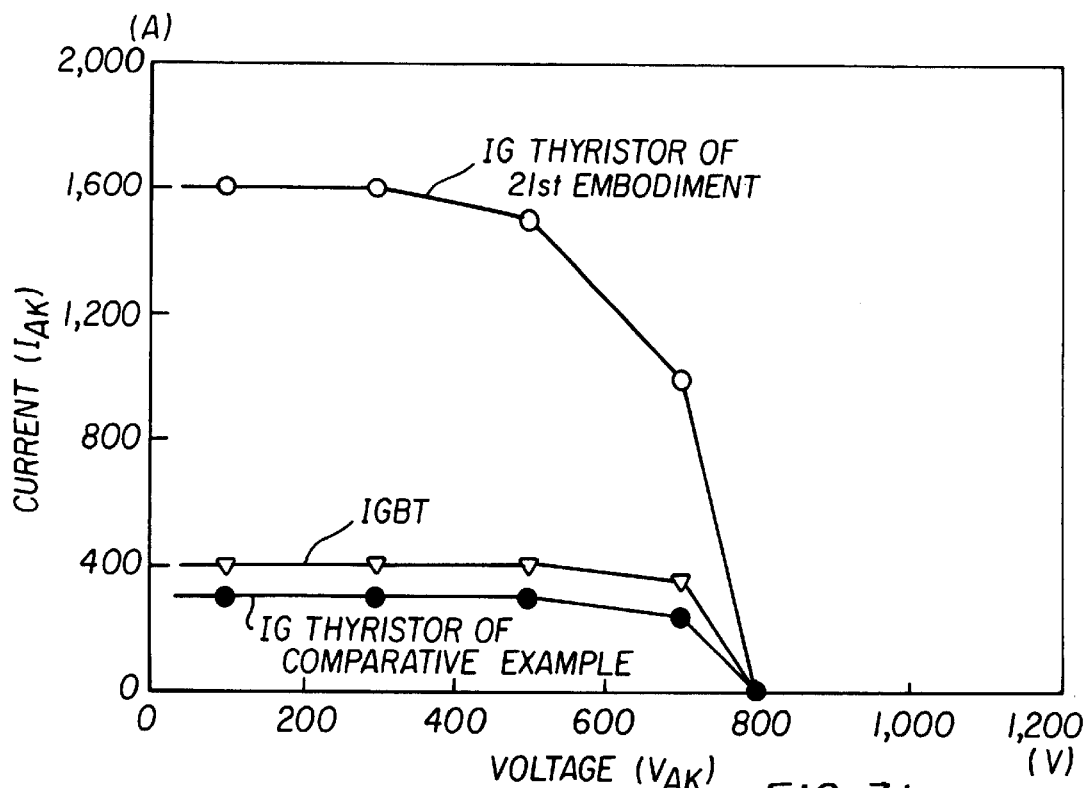
FIG. 31 is a graph showing RBSOA of 600 V-class devices of the twenty-first embodiment and comparative examples.

The graph of FIG. 31 shows reverse bias safe operation (RBSOA) of the insulated gate thyristor of the twenty-first embodiment in which the width of the n source regions 7 was 1.0 μm, a comparative example in the form of an insulated gate thyristor having 3.5 μm-width n source regions 7 and having no trench, and IGBT. The width of the n source regions of the IGBT was 3.5 μm.

It will be understood from FIG. 31 that the RBSOA of the present embodiment is especially large in the portion where the current density does not depend upon the voltage. This is because a parasitic thyristor is less likely to latch up in this insulated gate thyristor in which the width of the n source regions 7 is reduced.

Twenty-second Embodiment

Figure 33:
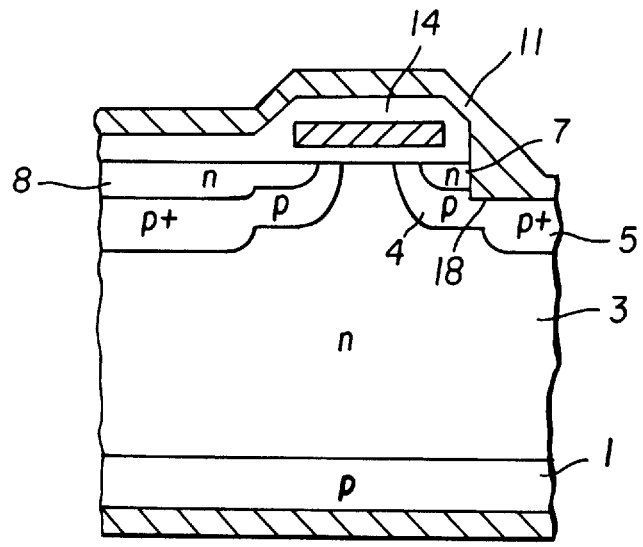
FIG. 33 is a cross-sectional view showing an insulated gate thyristor according to the twenty-second embodiment of the present invention.

FIG. 33 is a cross-sectional view of a part of an insulated gate thyristor according to the twenty-second embodiment of the present invention. As in the twentieth embodiment shown in FIG. 28, the trench 18 having a larger depth than the n source region 7 is formed in the silicon substrate, and the cathode 11 contacts with the side face of the n source region 7 exposed to the trench 18. This embodiment, however, may be produced as a 2500V-class insulated gate thyristor using a bulk wafer having a resistivity 200Ω.m and a thickness of 440 μm, in which the p emitter layer 1 is formed on the rear surface of the n base layer 3, with no n⁺ buffer layer interposed between these layers 1, 3. The planar pattern of this insulated gate thyristor is similar to the hexagonal cell pattern of FIG. 7.

Figure 32:
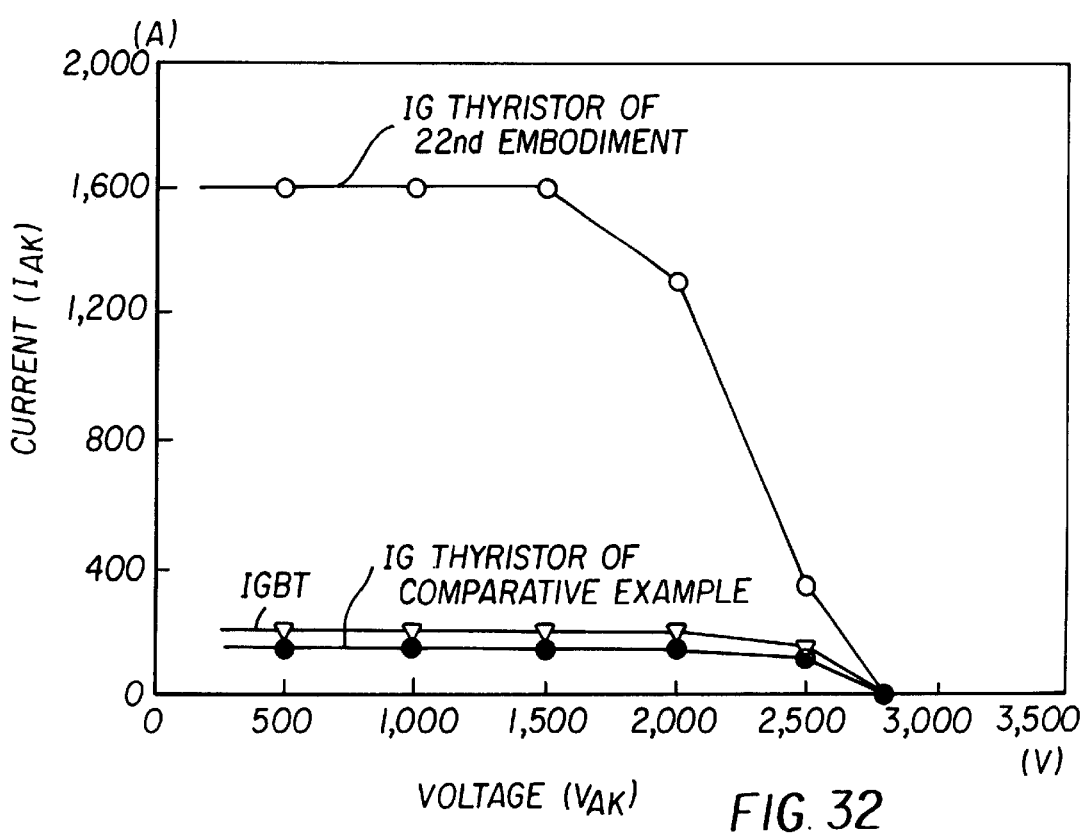
FIG. 32 is a graph showing RBSOA of 2500 V-class devices of the twenty-second embodiment and comparative examples.

The graph of FIG. 32 shows reverse bias safe operation areas (RBSOA) of the insulated gate thyristor of the twenty-second embodiment in which the width of the n source regions 7 was 1.0 μm, a comparative example in the form of an insulated gate thyristor having 3.5 μm-width n source regions 7 and no trench, and IGBT. The width of the n source regions of the IGBT was 3.5 μm.

It will be understood from FIG. 32 that the RBSOA of the present embodiment is especially large in the portion where the current density does not depend upon the voltage. This is because a parasitic thyristor is less likely to latch up in this insulated gate thyristor in which the width of the n source regions is reduced.

Thus, in the present embodiment, the ON-stage voltage can be reduced without deteriorating other characteristics, regardless of the resistivity of the n base layer 3 and the current amplification factor of the pnp wide base transistor. In other words, reduced ON-state voltage and improved RBSOA can be effectively achieved according to the present invention, without depending upon the rated voltage of the device, and the method of producing a semiconductor crystal of the substrate.

Twenty-third Embodiment

Figure 34:
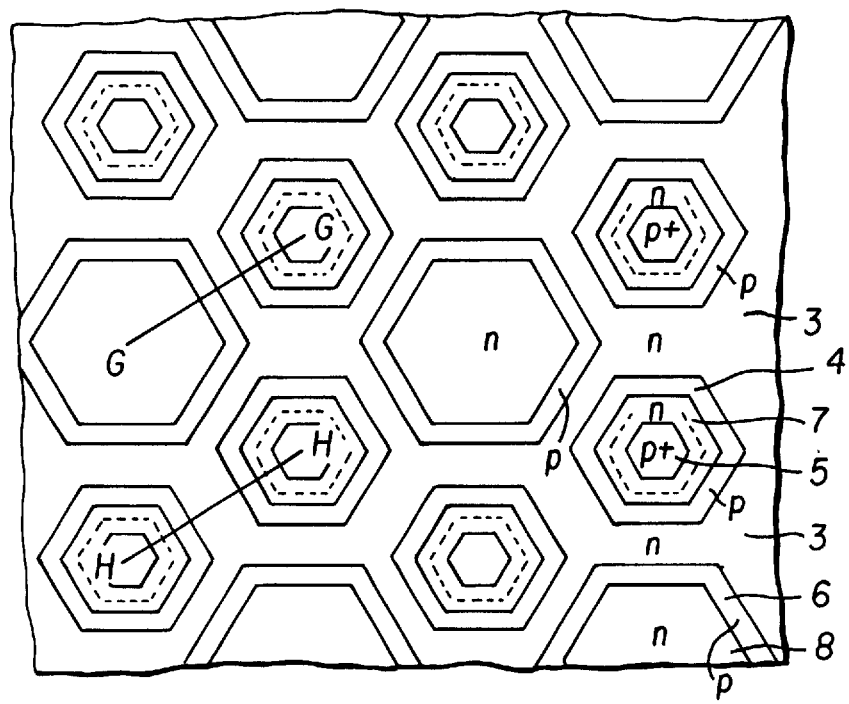
FIG. 34 is a plan view showing the surface of a silicon substrate of an insulated gate thyristor according to the twenty-third embodiment of the present invention.

A further structure for quickly discharging minority carriers during turn-off has been developed. FIG. 34 is a plan view showing respective diffusion regions formed in the surface of a silicon substrate of an insulated gate thyristor according to the twenty-third embodiment of the present invention, from which surface insulating films and electrodes are removed. While the pattern shown in FIG. 34 is similar to the hexagonal cell patterns used in many of the illustrated embodiments, an important feature of the present embodiment is present on the side of the anode electrode that is not shown in FIG. 34.

Figure 35A:
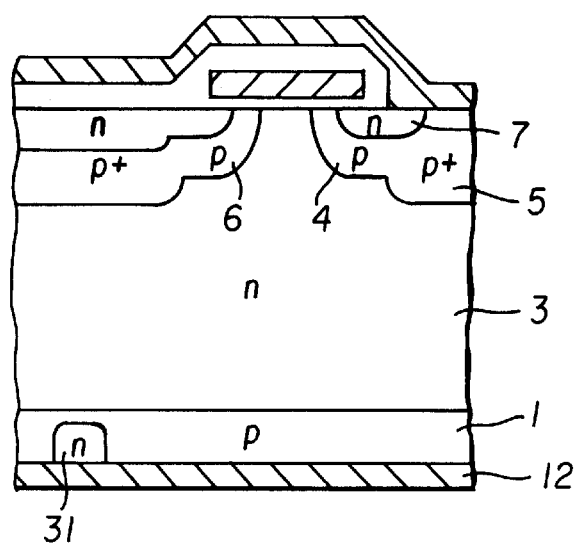
FIGS. 35(a) and 35(b) are cross-sectional views showing parts of the insulated gate thyristor of the twenty-third embodiment.
Figure 35B:
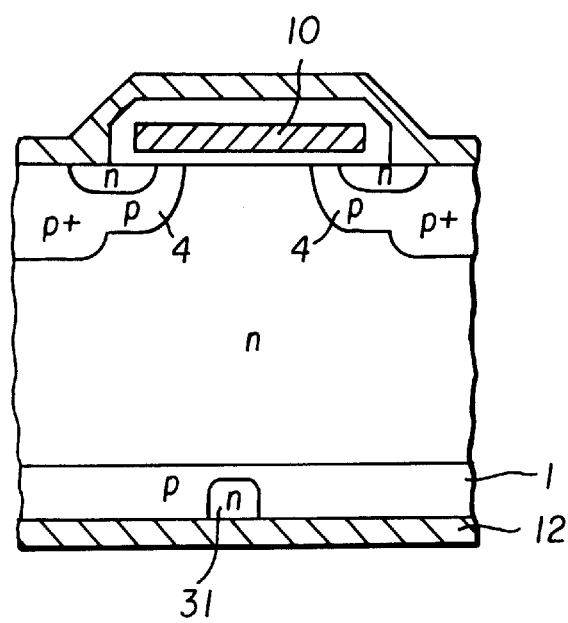

FIG. 35(a) is a cross-sectional view taken along line G—G that connects one first p base region 4 and one second p base region 6 in FIG. 34, and FIG. 35(b) is a cross-sectional view taken along line H—H connecting two first p base regions 4 that face each other through the n base layer 3. Referring to FIG. 35(a) and 35(b), the insulated gate thyristor of the present embodiment is different from those of the previous embodiments in that an n bypass region 31 is formed in the p emitter layer 1, and is short-circuited with the anode electrode 12.

The insulated gate thyristor of the twenty-third embodiment may be produced as a 1200V-class device using a bulk wafer, rather than an epitaxial wafer. Using an n type bulk wafer having a resistivity of 70Ω.cm and a thickness of 200 μm, the p emitter layer 1 is formed by implanting boron ions in a dose amount of $2 \times 10^{15}$ cm$^{-2}$, and diffusing the implanted ions by heat treatment, and the n bypass regions 31 are formed in the p emitter layer 1. Each of the n bypass regions 31 has a circular shape with a diameter of about 5 μm, and its diffusion depth is controlled so that several microns of p emitter layer 1 remains between the n bypass region 31 and the n base layer 3. The n bypass regions 31 are uniformly distributed and arranged in a right-triangle pattern or a grid pattern. The spacing between adjacent n bypass regions 31 is 31–50 μm, and the total area of the n bypass regions 31 is controlled to be several % of the entire area of the p emitter layer 1 so that these region 31 do not affect the ON-stage voltage.

Figure 36:
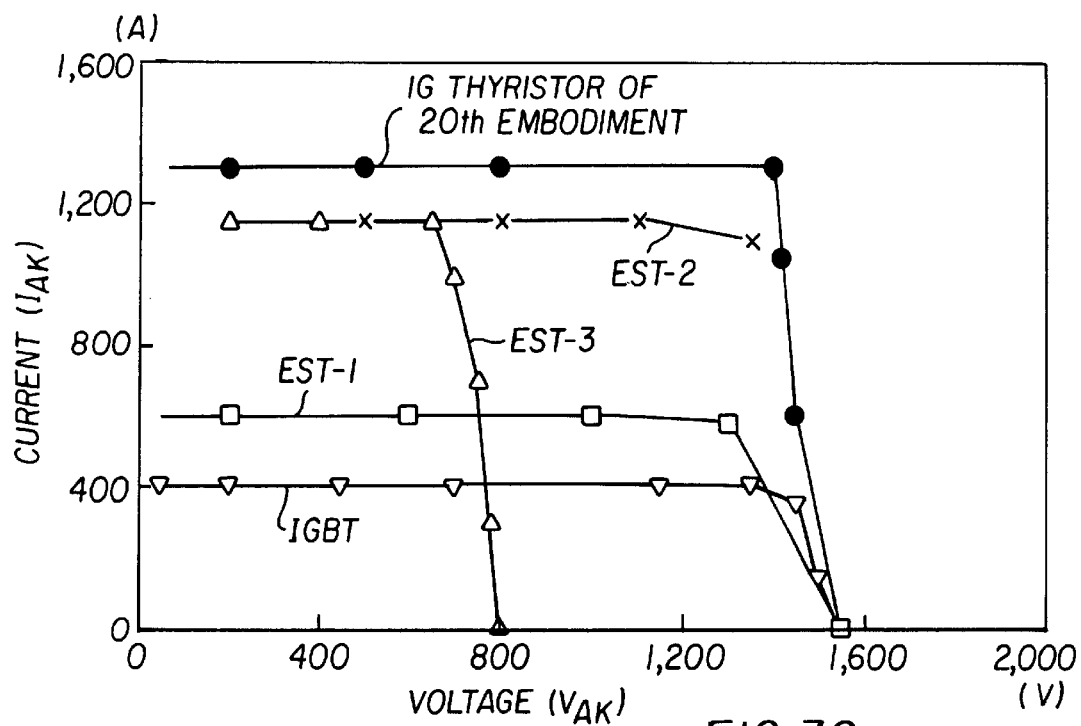
FIG. 36 is a graph showing RBSOA of 1200 devices of the twenty-third embodiment and comparative examples.

The graph of FIG. 36 shows results of measurement of RBSOA of 1200V devices, i.e., the insulated gate thyristor of the twenty-third embodiment, and EST-1, EST-2, EST-3 and IGBT as comparative examples. The widths of the n source region 7 and n emitter region 8 were 4 μm and 6 μm, respectively, and the width of the gate electrode layer 10 was 12 μm. The width of the n emitter regions of EST-2 and EST-3 was 20 μm, and the width of the gate electrode layers 10 of these devices was 15 μm. All of the above five types of devices had a chip size of 1 cm². When the lifetime of carriers was controlled in the same manner, the ON-stage voltage, as defined by a fall of the potential measured during conduction of 100 A.cm⁻, was 0.9V for the insulated gate thyristor of the twenty-third embodiment, 1.6V for EST-1, 1.7V for EST-2, 1.0V for EST-3, and 2.3V for IGBT.

It will be understood from FIG. 36 that the ON-stage voltage of the insulated gate thyristor of the twenty-third embodiment is lower than those of the other devices, and that the device of this embodiment has a reverse bias safe operation area that is three times as large as that of IGBT, and twice as large as that of EST-1, and thus assures a sufficiently high breakdown voltage.

The switching speed of the insulated gate thyristor of the present embodiment was 0.20 μs, and those of EST-1, EST-2 and IGBT were 0.3 μs, 0.20 μs, and 0.26 μs, respectively. Thus, the device of the present embodiment had the highest switching speed.

The RBSOA and switching speed of the present embodiment were increased due to the arrangement in which the n bypass regions 31 formed in the p emitter layer 1 are connected to the anode electrode 1, so that electrons are discharged from the n base layer 3 through these n bypass regions 31 during turn-off. It was known that the n bypass regions 31, when formed through the thickness of the p emitter layer 1 to reach the n base layer 3, serve as so-called emitter short through which the carriers are discharged. However, it was confirmed that electrons may be discharged through the n bypass region 31 to the anode electrode even if a thin portion of the p emitter layer 1 having a thickness of several microns is present between the n base layer 3 and the n bypass regions 31, as in the twenty-third embodiment. Accordingly, no holes are injected from the p emitter layer 1, and carriers are instantly discharged from the n base layer 3.

While the bulk wafer is used, and no high-concentration n⁺ buffer layer is present between the n base layer 3 and the p emitter layer 1, the present embodiment may be applied to a device having an n⁺ buffer layer, depending upon the manufacturing process.

Twenty-fourth Embodiment

Figure 37:
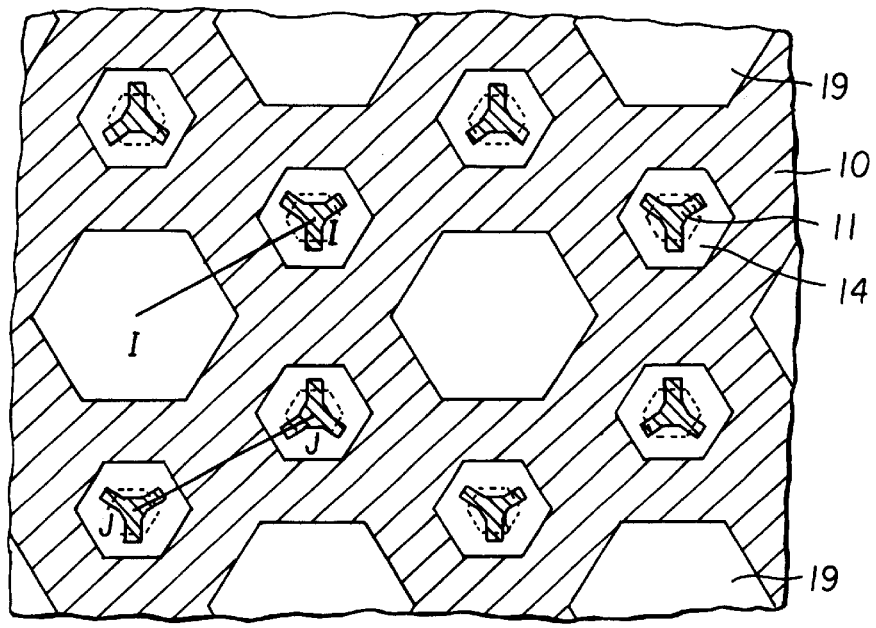
FIG. 37 is a cross-sectional view showing a horizontal plane that passes the middle of a gate electrode layer of an insulated gate thyristor according to the twenty-fourth embodiment of the present invention.

FIG. 37 is a cross-sectional view showing a horizontal plane that passes the middle of a gate electrode layer of an insulated gate thyristor according to the twenty-fourth embodiment of the present invention. In the mesh-like gate electrode layer 10, there are seen insulating films 19 having hexagonal outlines, and insulating films 14 having cathode electrodes 11 each of which protrudes in three directions. A pattern in which the insulating films 14 having the cathode electrodes 11 are disposed around the insulating film 19 having no cathode electrode 11 is repeated. The dotted lines in FIG. 37 indicate pn junctions between the n source regions 7 and p⁺ well region 5.

A plan view showing respective diffusion regions formed in the surface of the silicon substrate of the insulated gate thyristor of the twenty-fourth embodiment, from which insulating films and electrodes are removed, is similar to that of FIG. 9. Namely, hexagonal n emitter regions 8 are located under the hexagonal insulating films 19, and second phase p base regions 6 surround the n emitter regions 8. Also, n source regions 7 and the p⁺ well regions 5 are located under the insulating films 14, and first p base regions 4 surround the n source regions 7. The cathode electrode 11 is in contact with a part of the n source region 7 and the surface of the p⁺ well region 5. The most part of the silicon substrate located under the gate electrode layer 10 is an exposed surface portion of the n base layer 3.

Figure 38A:
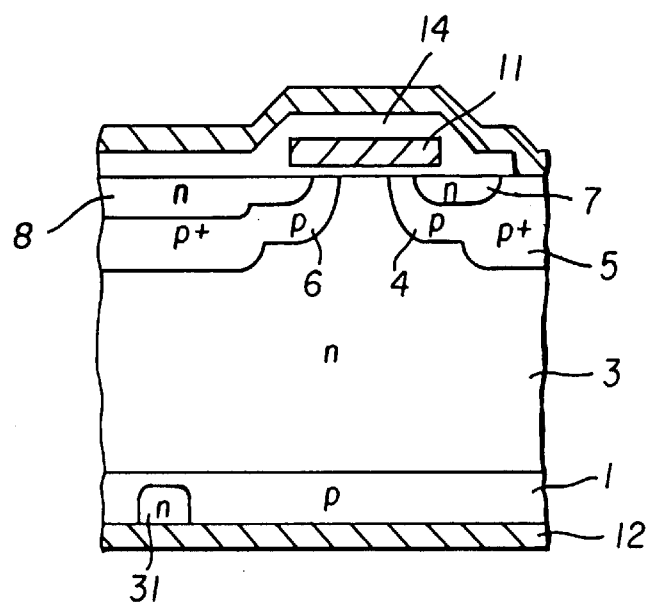
FIGS. 38(a) and 38(b) are cross-sectional views showing parts of the insulated gate thyristor of the twenty-fourth embodiment.
Figure 38B:
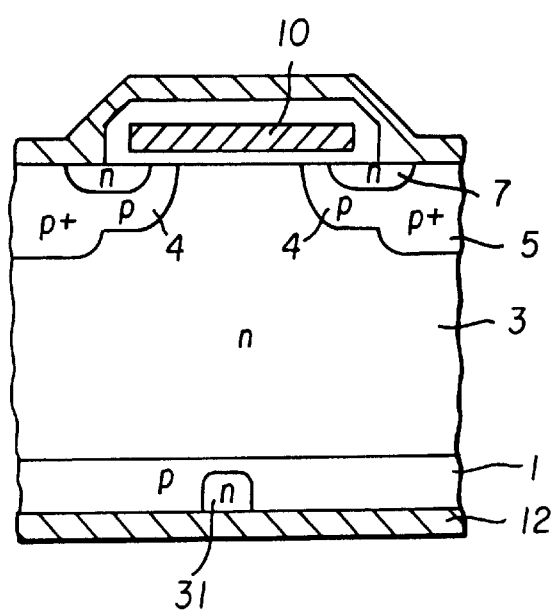

FIG. 38(a) and FIG. 38(b) are cross-sectional views of the insulated gate thyristor of the twenty-fourth embodiment of the present invention.

FIG. 38(a) is a cross-sectional view taken along line I—I connecting one of the insulating films 19 and one of the cathode electrodes 11. Although this cross-sectional view is similar to that of the insulated gate thyristor of the twenty-third embodiment of FIG. 35(a), the present embodiment is different from the twenty-third embodiment in that the surface of the n source region 7 is covered with the insulating film 14, and the cathode electrode 11 is not in contact with the n source region 7, but only in contact with the surface of the p⁺ well region 5.

FIG. 38(b) is a cross-sectional view taken along line J—J that connects two cathode electrodes 11 of FIG. 37. In this cross section, the cathode electrode 11 is in contact with surfaces of both of the n source region 7 and p⁺ well region 5, as in the insulating gate thyristor of the twenty-third embodiment. Similarly to the twenty-third embodiment, n bypass regions 31 are formed in the p emitter layer 1 and short-circuited with the anode electrode 12. Each of the bypass regions 31 has a circular shape with a diameter of about 5 µm, and its diffusion depth is controlled so that several microns of p emitter layer 1 remains between the n bypass region 31 and the n base layer 3. These n bypass regions 31 are uniformly distributed or arranged in a right-triangle pattern or a grid pattern. The spacing between adjacent n bypass regions 31 is 30–50 µm, and the total area of the n bypass regions 31 is controlled to be several % of the entire area of the p emitter layer so that these region 31 do not affect the ON-stage voltage.

In the insulated gate thyristor of the twenty-fourth embodiment, the surface of the n source region 7 is covered with the insulating film 14 and does not contact with the cathode electrode 11 in a portion of the first p base region 4 that is relatively close to the second p base region 6 and n emitter region 8, as shown in FIG. 38(a). In this arrangement, when current flows from the n emitter region 8 into the n source region 7 through an inversion layer right under the gate electrode layer 10 during turn-off, a parasitic thyristor consisting of n source region 7, first p base region 4, n base layer 3 and p emitter layer 1 is unlikely to latch up since the portion of the n source close to the second p baser region 6 is not short-circuited with the cathode electrode 11. Accordingly, the turn-off time can be advantageously reduced, assuring an increased breakdown voltage during turn-off, as compared with conventional devices wherein the turn-off time is increased due to injection of electrons from the n source region 7.

Although the cathode electrode 11 is in contact with the n source region 7 in a portion of the device where the n source regions 7 face each other, as seen in FIG. 38(b), this portion is not likely to latch up since the p⁺ well region 5 having a high impurity concentration is formed in a lower part of the first p base region 4.

The insulated gate thyristor of the present embodiment operates in a similar manner to that of the twenty-third embodiment. By providing the n bypass regions 17 in the p emitter layer 1, carriers can be easily discharged from the n base layer during turn-off, thus assuring an increased breakdown voltage. The insulated gate thyristor having the pattern of FIG. 37 may be produced in almost the same process in which the insulated gate thyristor of the twenty-third embodiment is produced.

If a plurality of features of the present invention as described are combined together, the resulting insulated gate thyristor is provided with further excellent characteristics due to combined effects of these features.

What is claimed is:

1. An insulated gate thyristor comprising:
    a first-conductivity-type base layer having a high resistivity;
    first and second-conductivity-type base regions formed in selected portions of a surface layer of said first-conductivity-type base layer at a first major surface thereof;
    a first-conductivity-type source region formed in a selected portion of a surface layer of said first second-conductivity-type base region;
    a first-conductivity-type emitter region formed in a selected portion of a surface layer of said second second-conductivity-type base region;
    a gate electrode layer formed on a gate insulating film over a surface of said first second-conductivity-type base region, an exposed portion of said first-conductivity-type base layer, and a surface of said second second-conductivity-type base region, which surfaces and exposed portions are interposed between said first-conductivity-type source region and said first-conductivity-type emitter region;
    a first main electrode that contacts with both an exposed portion of said first second-conductivity-type base region and said first-conductivity-type source region;
    a second-conductivity-type emitter layer formed on a second major surface of said first-conductivity-type base layer;
    a second main electrode that contacts with said second-conductivity-type emitter layer;
    a gate electrode that contacts with said gate electrode layer; and
    an insulating film covering entire areas of surfaces of said second second-conductivity-type base region and said first-conductivity-type emitter region,
    wherein said first-second conductivity-type base region has a lower impurity concentration than said second second-conductivity-type base region.

2. An insulated gate thyristor as claimed in claim 1, wherein said first-conductivity-type base layer comprises an epitaxial wafer including a first-conductivity-type buffer layer located between the first-conductivity-type epitaxial base layer and the second-conductivity-type emitter layer.

3. An insulated gate thyristor as claimed in claim 1, wherein said first-conductivity-type base layer comprises a bulk wafer.

* * * * *